United States Patent
Yano et al.

(10) Patent No.: US 9,064,758 B2
(45) Date of Patent: Jun. 23, 2015

(54) HIGH-CAPACITY MODULE INCLUDING THE PERIPHERAL CIRCUIT USING THE CIRCUIT BOARD AND THE CIRCUIT BOARD CONCERNED FOR PERIPHERAL CIRCUITS OF A HIGH-CAPACITY MODULE

(71) Applicant: NGK Insulators, Ltd., Nagoya (JP)

(72) Inventors: Shinsuke Yano, Nagoya (JP); Takami Hirai, Toyota (JP); Tsutomu Nanataki, Toyoake (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 140 days.

(21) Appl. No.: 13/630,866

(22) Filed: Sep. 28, 2012

(65) Prior Publication Data
US 2013/0094165 A1    Apr. 18, 2013

Related U.S. Application Data

(63) Continuation of application No. PCT/JP2011/073446, filed on Oct. 12, 2011.

(51) Int. Cl.
*H05K 1/11* (2006.01)
*H05K 1/14* (2006.01)
(Continued)

(52) U.S. Cl.
CPC ............ *H01L 23/13* (2013.01); *H01L 25/07* (2013.01); *H01L 25/18* (2013.01); *H01L 24/32* (2013.01);
(Continued)

(58) Field of Classification Search
CPC ....... H01L 23/057; H01L 23/13; H01L 23/24; H01L 23/36; H01L 23/49827; H01L 25/07; H01L 25/18

USPC ............... 361/764–766, 790, 792–795, 803
See application file for complete search history.

(56) References Cited

U.S. PATENT DOCUMENTS

RE35,765 E  *  4/1998  Tuttle ............................ 257/793
6,212,070 B1 *  4/2001  Atwood et al. ............... 361/704
(Continued)

FOREIGN PATENT DOCUMENTS

EP        1 739 740 A2    1/2007
JP        57-010748 U     1/1982
(Continued)

OTHER PUBLICATIONS

Fengqun Lang, et al., "*A Three-Dimensional Packaging Method for Al-Metalized SiC Power Devices*," the 18th Microelectronics Symposium, Sep. 2008, pp. 219-222.
(Continued)

*Primary Examiner* — Tuan T Dinh
(74) *Attorney, Agent, or Firm* — Burr & Brown, PLLC

(57) ABSTRACT

Problems, such as increase in the electrical resistance in the junction(s) of the terminal(s) of a power semiconductor element and the electrode(s) of a peripheral circuit and decrease in the dielectric strength voltage between adjacent junctions, resulting from the insufficient alignment of the power semiconductor element terminal(s) and the the peripheral circuit electrode(s), in the high-capacity module which is intended to attain reduction in size and weight, reduction in surge, and reduction in loss by lamination of the peripheral circuit onto the power circuit, should be reduced. By preparing level difference(s) in the surface of the peripheral circuit board to more accurately align the peripheral circuit board electrode(s) and the power semiconductor element terminal(s) by contact of the level difference(s) and the lateral face(s) of the power semiconductor element at the time of lamination of the power circuit and the peripheral circuit, the above-mentioned problems can be reduced.

17 Claims, 4 Drawing Sheets

(51) Int. Cl.
*H01L 23/13* (2006.01)
*H01L 25/07* (2006.01)
*H01L 25/18* (2006.01)
*H01L 23/057* (2006.01)
*H01L 23/24* (2006.01)
*H01L 23/36* (2006.01)
*H01L 23/498* (2006.01)
H01L 23/00 (2006.01)

(52) U.S. Cl.
CPC ....... *H01L 24/33* (2013.01); *H01L 2224/32227* (2013.01); *H01L 2224/32237* (2013.01); *H01L 2224/32238* (2013.01); *H01L 2224/33181* (2013.01); *H01L 23/057* (2013.01); *H01L 23/24* (2013.01); *H01L 23/36* (2013.01); *H01L 23/49827* (2013.01); H01L 2224/32245 (2013.01); H01L 2924/13055 (2013.01); H01L 2924/13091 (2013.01); H01L 2924/1305 (2013.01)

(56) References Cited

U.S. PATENT DOCUMENTS

| | | | |
|---|---|---|---|
| 6,953,999 | B2* | 10/2005 | Strandberg et al. ........... 257/778 |
| 2005/0104196 | A1* | 5/2005 | Kashiwazaki ................ 257/706 |
| 2006/0065972 | A1* | 3/2006 | Khan et al. .................... 257/712 |
| 2008/0305582 | A1* | 12/2008 | Fillion et al. .................. 438/118 |
| 2012/0129299 | A1* | 5/2012 | Lin et al. ...................... 438/118 |

FOREIGN PATENT DOCUMENTS

| | | |
|---|---|---|
| JP | 08-162579 A1 | 6/1996 |
| JP | 3410696 B2 | 3/2003 |
| JP | 2005-150596 A1 | 6/2005 |
| JP | 2006-303006 A1 | 11/2006 |
| JP | 2007-012831 A1 | 1/2007 |
| JP | 2011-023654 A1 | 2/2011 |

OTHER PUBLICATIONS

International Search Report and Written Opinion dated Nov. 8, 2011.

* cited by examiner (a)

(b)

HIGH-CAPACITY MODULE INCLUDING THE PERIPHERAL CIRCUIT USING THE CIRCUIT BOARD AND THE CIRCUIT BOARD CONCERNED FOR PERIPHERAL CIRCUITS OF A HIGH-CAPACITY MODULE

BACKGROUND OF THE INVENTION

1. Technical Field

The present invention relates to a circuit board for the peripheral circuits of a high-capacity module. More particularly, the present invention relates to a circuit board for the peripheral circuits laminated with a circuit including a power semiconductor element, for example, in high-capacity modules including power modules, such as an inverter used in a hybrid vehicle or an electric vehicle. Furthermore, the present invention relates also to a high-capacity module including a peripheral circuit which uses the circuit board.

2. Description of Related Art

Conventionally, in high-capacity (large electric power) modules including power modules, such as an inverter, a circuit (henceforth, may be also referred to as a "power circuit") including a power semiconductor element, such as a switching element (for example, IGBT (Insulated Gate Bipolar Transistor), MOSFET (Metal-Oxide-Semiconductor Field-Effect Transistor) etc.) has been arranged in planar with, for example, a peripheral circuit (henceforth, may be also referred to as a "drive circuit") which controls such a power semiconductor element, and the area for arranging the wiring (wire) for connecting these circuits has been required. These have been factors which hinder reduction in size and weight of a high-capacity module.

In this specification, a high-capacity module refers to the module handling the voltage of 200V or more, or the large electric power of 10 A or more. As an example of such a high-capacity module, for example, what is called a "power module" etc. can be exemplified.

In addition, concerns that wiring length became long due to the wiring for connecting the various circuits which constitute the high-capacity modules as mentioned above, the loss as the whole module becomes larger, and the surge voltage which generates on switching due to the equivalent inductance of the wire becomes larger have been recognized. Excessive surge voltage has a possibility of damaging, for example, a semiconductor element in a drive circuit etc.

By the way, in recent years, for example, along with the popularization of hybrid vehicles and of electric vehicles etc., further improvement in performance such as reduction in size and weight, reduction in surge (surge control), and higher-efficiency (reduction in a loss), etc. is increasingly demanded.

Then, approaches to laminate the circuit boards for various circuits which constitute high-capacity modules as mentioned above in order to attain reduction in size and weight of the high-capacity modules and to improve the connection configuration between the various circuit boards which constitute the high-capacity modules in order to attain reduction in surge and reduction in a loss have been proposed (refer to Patent documents 1 to 3).

When the various circuit boards which constitute a high-capacity module are laminated, as mentioned above, to attain reduction in size and weight of the module, it is known to connect the terminal(s) of a semiconductor element directly to the surface electrode(s) prepared in the surface of a wiring board instead of the connection (wire bond) with wiring (wire) (for example, refer to Patent document 1).

However, the above-mentioned method had a problem that the alignment of the terminal(s) of a semiconductor element with the surface electrode(s) or leadframe terminal(s) of a wiring board was difficult. When the alignment of the terminal of a semiconductor element and the surface electrode(s) or leadframe terminal(s) of a wiring board is insufficient, a problem that the electrical resistance becomes large in the junction(s) constituted with the terminal(s) of a semiconductor element and the surface electrode(s) or leadframe terminal(s) of a wiring board or a problem that the dielectric strength voltage between adjacent junctions becomes insufficient might occur.

Specifically, when the alignment of the terminal(s) of a semiconductor element and the surface electrode(s) or leadframe terminal(s) of a wiring board is insufficient, the contact area of the terminal(s) of a semiconductor element and the surface electrode(s) or leadframe terminal(s) of a wiring board in the junction(s) becomes smaller. As a result, there is a possibility that the electrical resistance in the junction may become larger and it may become impossible to pass an electric current as large as needed for a high-capacity module. Moreover, misalignment of the terminal(s) of a semiconductor element and the surface electrode(s) or leadframe terminal(s) of a wiring board decreases the gap between adjacent junctions. As a result, in these junctions, it may become impossible to secure the dielectric strength voltage needed for applying an electric current with high current or high voltage.

Namely, when the various circuit boards which constitute a high-capacity module are to be laminated to attain reduction in size and weight of the module, it is very important to accurately align the terminal(s) of a power semiconductor element with the surface electrode(s) or leadframe terminal(s) of a wiring board, in order to avoid the problems that the electrical resistance becomes large in the junction(s) constituted with the terminal(s) of the semiconductor element and the surface electrode(s) or leadframe terminal(s) of the wiring board, or the dielectric strength voltage between adjacent junctions becomes insufficient.

However, in the art, when the various circuit boards which constitute a high-capacity module are to be laminated to attain reduction in size and weight of the module, the effective technology which enables the accurate alignment of the terminal(s) of a power semiconductor element and the surface electrode(s) or leadframe terminal(s) of a wiring board in the junction constituted with the terminal(s) of the power semiconductor element or the surface electrode(s) or leadframe terminal(s) of the wiring board has not yet proposed, and therefore a continuous demand to such a technology has been existing.

CITATION LIST

Patent Literature

[PTL 1] Japanese Patent Application Laid-Open (kokai) No. 2006-303006
[PTL 2] Japanese Patent No. 3410696
[PTL 3] Japanese Patent Application Laid-Open (kokai) No. 2011-23654
[PTL 4] Japanese Patent Application Laid-Open (kokai) No. 2007-012831

Non Patent Literature

[NPL 1] "A Three-Dimensional Packaging Method for Al-Metalized SiC Power Devices", Fengqun Lang, Yusuke Hayashi, Hiroshi Nakagawa, Masahiro Aoyagi, and Hiromichi Ohashi, the 18th Microelectronics Symposium, September 2008, p. 219-222

SUMMARY OF THE INVENTION

Technical Problem

As mentioned above, in the art, when the various circuit boards which constitute a high-capacity module are to be laminated to attain reduction in size and weight of the module, the effective technology which enables the accurate alignment of the terminal(s) of a power semiconductor element and the surface electrode(s) or leadframe terminal(s) of a wiring board in the junction constituted with the terminal(s) of the power semiconductor element and the surface electrode(s) or leadframe terminal(s) of the wiring board has not yet proposed, and therefore a continuous demand to such a technology has been existing.

The present invention has been conceived in order to meet such a demand. More specifically, the present invention has an objective to reduce problems, such as increase in the electrical resistance in the junction(s) of the terminal(s) of a power semiconductor element and the electrode(s) of a peripheral circuit which are disposed on a power circuit and decrease in the dielectric strength voltage between adjacent junctions, resulting from the insufficient alignment of the terminal(s) of the power semiconductor element and the electrode(s) of the peripheral circuit, in the high-capacity module which is intended to attain reduction in size and weight, reduction in surge, and reduction in a loss by lamination of the peripheral circuit, such as a drive circuit, onto the power circuit.

Solution to Problem

The above-mentioned objective can be achieved by;

a substrate which is a second electronic circuit board used for the second electronic circuit laminated on the side of a first electronic circuit including a power semiconductor element, on which said power semiconductor element is disposed, via said power semiconductor element, wherein:

said substrate comprises a base material which comprises a dielectric layer, inner layer electrode(s) embedded inside of said base material, first surface electrode(s) formed at a first surface that is the surface on the side of said first electronic circuit of said substrate, and at least one level difference(s) prepared at said first surface, the thickness of at least a part of said inner layer electrode(s) and said first surface electrode(s) is not less than 50 micrometers in a direction perpendicular to said first surface, and said level difference(s) are formed so that each of said terminal(s) of said power semiconductor element and each of said first surface electrode(s) may be opposed to each other, when said power semiconductor element and said substrate are in the relative positional relationship specified by contact of the lateral face(s), which intersects the surface opposed to said first surface, of said power semiconductor element with the lateral face(s), which intersect said first surface, of said level difference(s) at the time of lamination of said first electronic circuit and said second electronic circuit.

Advantageous Effects of Invention

As mentioned above, the substrate according to the present invention is used in the (second) electronic circuit (for example, peripheral circuits, such as a drive circuit) used by laminating with the (first) electronic circuit (for example, power circuit) including a power semiconductor element with an objective of reduction in size and weight of high-capacity modules including power modules, such as an inverter, etc.

In the substrate according to the present invention, as mentioned above, by preparing level difference(s) in the surface of the second electronic circuit board and more accurately aligning the electrode(s) of the second electronic circuit board and the terminal(s) of the power semiconductor element at the time of lamination of the first electronic circuit and the second electronic circuit, problems, such as increase in the electrical resistance in the junction(s) of the terminal(s) of the power semiconductor element and the electrode(s) of the peripheral circuit and decrease in the dielectric strength voltage between adjacent junctions, etc. can be reduced.

DETAILED DESCRIPTION OF THE INVENTION

Figure 1:
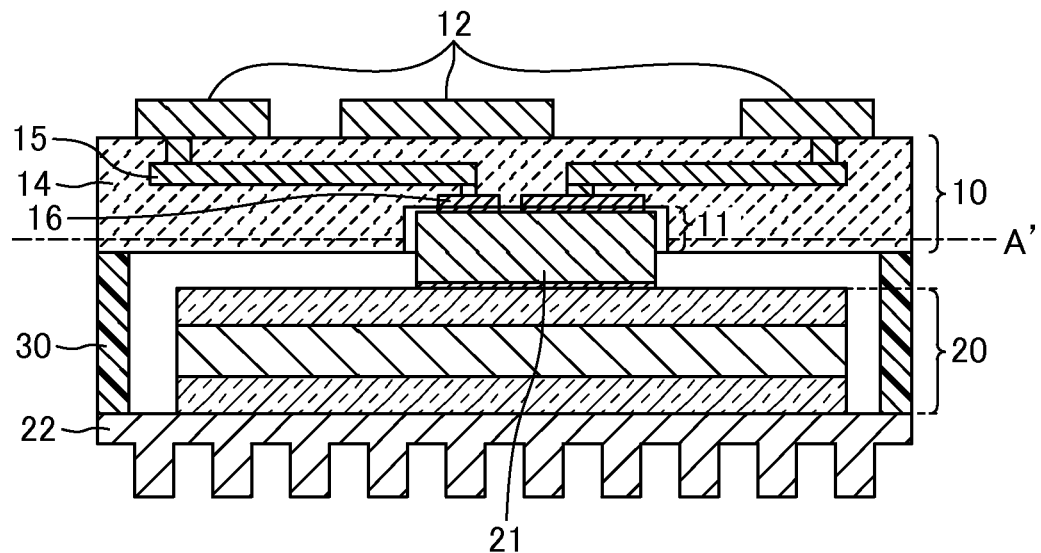
FIG. 1 A schematic view showing the configuration of a substrate, which has level differences formed by depressions (concave portions) prepared at the first surface, according to one embodiment of the present invention, and a high-capacity module including the substrate.

As mentioned above, the present invention has an objective to reduce problems, such as increase in the electrical resistance in the junction(s) of the terminal(s) of a power semiconductor element and the electrode(s) of a peripheral circuit which are disposed on a power circuit and decrease in the dielectric strength voltage between adjacent junctions, resulting from the insufficient alignment of the terminal(s) of the power semiconductor element and the electrode(s) of the peripheral circuit, in the high-capacity module which is intended to attain reduction in size and weight, reduction in surge, and reduction in a loss by lamination of the peripheral circuit, such as a drive circuit, onto the power circuit.

As a result of wholehearted research for achieving the above-mentioned objective, the inventors have conceived to reduce problems, such as increase in the electrical resistance in the junction(s) of the terminal(s) of a power semiconductor element and the electrode(s) of a peripheral circuit and decrease in the dielectric strength voltage between adjacent junctions by preparing level difference(s) in the surface of the peripheral circuit board and more accurately aligning the electrode(s) of the peripheral circuit board with the terminal(s) of the power semiconductor element at the time of lamination of a power circuit and a peripheral circuit by virtue of contact of the level difference(s) and lateral face(s) of the power semiconductor element, in a high-capacity module which is intended to attain reduction in size and weight, reduction in surge, and reduction in a loss by lamination of the peripheral circuit, such as a drive circuit, onto the power circuit.

Namely, the first embodiment of the present invention is;

a substrate which is a second electronic circuit board used for the second electronic circuit laminated on the side of a first electronic circuit including a power semiconductor element, on which said power semiconductor element is disposed, via said power semiconductor element, wherein:

said substrate comprises a base material which comprises a dielectric layer, inner layer electrode(s) embedded inside of said base material, first surface electrode(s) formed at a first surface that is the surface on the side of said first electronic circuit of said substrate, and at least one level difference(s) prepared at said first surface, the thickness of at least a part of said inner layer electrode(s) and said first surface electrode(s) is not less than 50 micrometers in a direction perpendicular to said first surface, and said level difference(s) are formed so that each of said terminal(s) of said power semiconductor element and each of said first surface electrode(s) may be opposed to each other, when said power semiconductor element and said substrate are in the relative positional relationship specified by contact of the lateral face(s), which intersects the surface opposed to said first surface, of said power semiconductor element with the lateral face(s), which intersects said first surface, of said level difference(s) at the time of lamination of said first electronic circuit and said second electronic circuit.

As mentioned above, when reduction in size and weight of high-capacity (large electric power) modules including power modules, such as an inverter etc., by using a substrate according to the present embodiment as a substrate which constitutes a peripheral circuit (the second electronic circuit), such as a drive circuit, to laminate the second electronic circuit on the side, on which a power semiconductor element is disposed, of an electronic circuit (the first electronic circuit) including the power semiconductor element, via the power semiconductor element, not only the reduction in size and weight, reduction in surge, and reduction in a loss can be attained, but also problems, such as increase in the electrical resistance in the junction(s) of the terminal(s) of the power semiconductor element and the electrode(s) of the peripheral circuit and decrease in the dielectric strength voltage between adjacent junctions, can be reduced by preparing level difference(s) at the first surface of the substrate according to the present embodiment, which is the second electronic circuit board, and more accurately aligning the electrode(s) of the second electronic circuit board with the terminal(s) of the power semiconductor element at the time of lamination of the first electronic circuit and the second electronic circuit by contact of the lateral face(s) of the level difference(s) with the lateral face(s) of the power semiconductor element.

Herein, aligning the electrode(s) of the second electronic circuit board with the terminal(s) of the power semiconductor element at the time of lamination of the first electronic circuit and the second electronic circuit by contact of the lateral face(s) of the level difference(s) prepared at the first surface of the substrate according to the present embodiment, which is the second electronic circuit board, with the lateral face(s) of the power semiconductor element is a concept including not only an embodiment wherein the electrode of the second electronic circuit board and the terminal(s) of the power semiconductor element is aligned by direct contact of the lateral face(s) of the level difference(s) and the lateral face(s) of the power semiconductor element, but also an embodiment wherein a gap exists between the lateral face(s) of the level difference(s) and the lateral face(s) of the power semiconductor element, as long as the effect of the present invention which reduces problems, such as increase in the electrical resistance in the junction(s) of the terminal(s) of the power semiconductor element and the electrode(s) of the peripheral circuit and decrease in the dielectric strength voltage between adjacent junctions, etc. is not spoiled.

For example, as will be mentioned later, in the substrates according to the present invention, embodiments wherein the power semiconductor element is sandwiched or surrounded among plural level differences at the time of lamination of the first electronic circuit and the second electronic circuit, or embodiments wherein the power semiconductor element is fitted into a depression (concave portion) demarcated by the lateral face(s) of the level difference(s) and the first surface at the time of lamination of the first electronic circuit and the second electronic circuit may be assumed. In such embodiments, for the purpose of making it easier to fit the power semiconductor element into the space sandwiched or surrounded among plural level differences or into the depression demarcated by the lateral face(s) of the level difference(s) and the first surface, the cross section by a plane parallel to the first surface of such a space or depression may be configured so as to be a little bit larger than the cross section by a plane parallel to the first surface of the power semiconductor element. In this case, in the relative spatial relationship of the second electronic circuit board and the power semiconductor element, variability resulting from the difference in dimension of the above-mentioned space or depression and the outline of the power semiconductor element may arise. However, the loss of the effect of the present invention as mentioned above can be avoided by constituting the level difference(s) so that the difference in dimension may become small enough.

In addition, as mentioned above, the above-mentioned high-capacity modules may be power modules, such as an inverter, or may be other high-capacity modules handling large electric power. Moreover, as mentioned above, although, for example, a switching element etc. can be exemplified as the above-mentioned power semiconductor element when the above-mentioned high-capacity modules are power modules, such as an inverter, the power semiconductor element in the present embodiment may not be limited to a switching element and may be any element handling high-capacity electric power in a high-capacity module. Furthermore, although, for example, IGBT, MOSFET, etc. can be exemplified as the switching element when the above-mentioned power semiconductor element is the switching element, the switching element in the present embodiment may be limited to neither IGBT nor MOSFET and may be any switching element known in the art.

As mentioned above, the substrate according to the present embodiment is a substrate which is a second electronic circuit board used for the second electronic circuit laminated on the side of a first electronic circuit including a power semiconductor element, on which said power semiconductor element is disposed, via said power semiconductor element, and comprises a base material which comprises a dielectric layer, inner layer electrode(s) embedded inside of the base material, first surface electrode(s) formed at a first surface that is the surface on the side of the first electronic circuit of the substrate, and at least one level difference(s) prepared at the first surface.

The material of the dielectric layer is not limited and dielectric material which comprises an insulation material, such as resin, glass, and ceramics, etc. can be used. The inner layer electrode(s) and the first surface electrode(s) can be prepared in the surface and/or the inside of the substrate by various techniques well-known in the art, such as plating of conductors, such as metal, etching processing, burial of a conductive pattern, printing of conductive paste, etc. Moreover, the first surface electrode(s) may be formed by the leadframe(s) disposed at the first surface. In addition, in any case, it is desirable that the inner layer electrode(s) and the first surface electrode(s) consist of a good conductor which has small electrical resistance.

Moreover, for example, the level difference(s) may be formed by the lateral face(s) (face(s) which intersects the first surface) of the projection(s) prepared at the first surface, may be formed by flange-like structure(s) prepared so as to surround the lateral face(s) of the power semiconductor element at the time of lamination, or may be formed by the depression (concave portion) prepared so that the power semiconductor element might fit into it at the time of lamination.

The projection(s), the flange-like structure(s), and the depression can be formed and disposed in a suitable size, form, and a position in accordance with the shape of the power semiconductor element and arrangement thereof in the first electronic circuit, the configuration of the production line which laminates the first electronic circuit and the second electronic circuit, etc. For example, when the shape of the cross section by a plane parallel to the first surface of the power semiconductor element is a rectangle, one or more projections, flange-like structures, and depression may be disposed at the first surface so that each terminal of the power semiconductor element and each first surface electrode may be opposed to each other, by contact of any or all of four lateral faces (intersecting the surface opposed to the first surface) of the power semiconductor element with the lateral face(s) (intersecting the first surface) of the level difference(s) formed by the projection(s), the flange-like structure(s), or the depression, at the time of lamination of the first electronic circuit and the second electronic circuit.

In the above, the lateral face(s) of the level difference(s) formed by the projection(s), the flange-like structure(s), or the depression may not necessarily have to be formed so as to contact with all the lateral faces of the power semiconductor element. For example, the direction, in which the terminal(s) of the power semiconductor element and the first surface electrode(s) may be misaligned at the time of lamination, may be limited to a specific direction due to the configuration of the production line which laminates the first electronic circuit and the second electronic circuit. In such a case, by preparing at least one level difference(s) so that the lateral face(s) of the power semiconductor element and the lateral face(s) of the level difference(s) intersecting the direction can contact, the terminal(s) of the power semiconductor element and the first surface electrode(s) can be prevented from being misaligned. On the other hand, when the relative spatial relationship of the terminal(s) of the power semiconductor element and the first surface electrode(s) cannot be uniquely determined, plural level differences can be prepared at the first surface of the substrate according to the present embodiment to uniquely determine the relative spatial relationship of the terminal(s) of the power semiconductor element and the first surface electrode(s) at the time of lamination.

On the other hand, when the terminal(s) of the power semiconductor element and the first surface electrode(s) cannot be prevented from being misaligned, unlike in the substrate according to the present embodiment, the alignment of the terminal(s) of the power semiconductor element and the first surface electrode(s) becomes insufficient (inaccurate), and thereby problems, such as increase in the electrical resistance in the junction constituted by the terminal(s) of the power semiconductor element and the first surface electrode(s) and insufficient dielectric strength voltage between adjacent junctions, etc. may arise, as mentioned above.

Specifically, when the alignment of the terminal(s) of the power semiconductor element and the first surface electrode(s) is insufficient, at the junction of the terminal(s) of the power semiconductor element and the first surface electrode(s), the terminal(s) of the power semiconductor element and the first surface electrode(s) are not correctly opposed to be in a state where they are misaligned mutually, and the contact area of the terminal(s) of the power semiconductor element and the first surface electrode(s) becomes smaller. As a result, there is a possibility that the electrical resistance in the junction may become larger and it may become impossible to pass an electric current as large as needed for a high-capacity module. Moreover, for example, misalignment of the terminal(s) of the power semiconductor element and the first surface electrode(s) makes the gap between the terminal of the power semiconductor element which constitutes one junction and the first surface electrode which constitutes the other junction in adjacent junctions smaller as compared with the case where they are aligned accurately. As a result, it may become impossible to secure the dielectric strength voltage needed for applying an electric current with high current or high voltage between these two junctions.

However, in the substrate according to the present embodiment, the power semiconductor element and the substrate which is the second electronic circuit board is accurately aligned by contact of the lateral face(s) of the power semiconductor element with the lateral face(s) of the level difference(s), and each terminal of the power semiconductor element and each first surface electrode are opposed correctly. As a result, the problems that electrical resistance may become larger in the junction(s) constituted with the terminal(s) of the power semiconductor element and the first surface electrode(s) or the dielectric strength voltage between adjacent junctions becomes insufficient are reduced.

In addition, for example, depending on the design specification and configuration of a high-capacity module in which the substrate according to the present embodiment is used, all the terminals of the power semiconductor element and all the first surface electrodes may not necessarily be connected electrically. As a precautionary measure, it is mentioned in other words that the present embodiment never requires electrically connecting all the terminals of the power semiconductor element and all the first surface electrodes.

As mentioned above, in the substrate according to the present embodiment, the power semiconductor element which is disposed on the first electronic circuit and the substrate according to the present embodiment which is the second electronic circuit board are accurately aligned so that each terminal of the power semiconductor element and each first surface electrode may be opposed accurately at the time of lamination of the first electronic circuit and the second electronic circuit. Thereby, in the high-capacity module using the substrate according to the present embodiment, the power semiconductor element and the second electronic circuit can be connected in a shorter distance as compared with the conventional technology, such as a wire bond. As a result, the inductance between the first electronic circuit (for example, power circuit) including a power semiconductor element and the second electronic circuit (for example, peripheral circuits, such as a drive circuit) including the substrate according to the present embodiment can be made smaller. Thereby, in high-capacity modules (for example, power module etc.) including these circuits, for example, the surge voltage at the time of switching can be suppressed (reduction in surge).

In addition, although the electrical connection of the first surface electrode(s) disposed at the first surface of the substrate according to the present embodiment and the terminal(s) of the power semiconductor element can be achieved, for example, by means of soldering, the methods for connecting them are not limited to a specific technique, and the electrical connection of the conductor which constitute the first surface electrode(s) and the terminal(s) of the power semiconductor element may be achieved using any of the techniques known in the art.

As mentioned above, the substrate according to the present embodiment is the second electronic circuit board used for the second electronic circuit laminated through a power semiconductor element on the side, on which the above-mentioned power semiconductor element is disposed, of the first electronic circuit including the power semiconductor element. Therefore, it is assumed that a large electric current flows through the inner layer electrode(s) or first surface electrode(s) which the substrate includes. Therefore, in the substrate according to the present embodiment, it is desirable that the thickness (in a direction perpendicular to the first surface) of at least a part of the inner layer electrode(s) and the first surface electrode(s) is not less than 50 micrometers, more preferably not less than 50 micrometers. Thereby, the loss as the whole module including the electronic circuit which uses the substrate according to the present embodiment can be reduced.

As mentioned above, the first surface electrode(s) in the substrate according to the present embodiment electrically connects the second electronic circuit (for example, peripheral circuits, such as a drive circuit) including the substrate according to the present embodiment with the power semiconductor element included in the first electronic circuit (for example, power circuit). Therefore, since it is assumed that a large current flows through the first surface electrode(s), in order to make the loss in the first surface electrode(s) smaller, it is desirable to enlarge the contact area of the power semiconductor element and the first surface electrode(s). Similarly, it is desirable to also enlarge the thickness of the conductor which constitutes the first surface electrode(s).

In addition, as mentioned above, the substrate according to the present embodiment is the substrate used in the second electronic circuit (for example, peripheral circuits, such as a drive circuit) used by laminating with the first electronic circuit (for example, power circuit) including a power semiconductor element, for example, for the purpose of reduction in size and weight of high-capacity modules including power modules, such as an inverter. Therefore, various circuit elements which constitute a peripheral circuit, such as a drive circuit, can be disposed on the surface (the second surface) on the side opposite to the first electronic circuit of the substrate (the second electronic circuit board) according to the present embodiment.

As mentioned above, the high-capacity module using the substrate according to the present embodiment has the configuration in which the power semiconductor element is sandwiched between the first electronic circuit board and the second electronic circuit board. In such a configuration, it generally tends to become difficult to release the heat generated from the power semiconductor element outside. However, in the substrate according to the present embodiment, as mentioned above, the terminal(s) of the power semiconductor element and the first surface electrode(s) are directly connected not through a wire etc. Thereby, since the substrate according to the present embodiment can efficiently transmit the heat generated from the power semiconductor element, the heat generated from the power semiconductor element can be released, for example, by disposing a heat dissipation mechanism, such as a heat sink, on the side of the second surface of the substrate according to the present embodiment. In this case, in the high-capacity module using the substrate according to the present embodiment, heat dissipation mechanisms, such as a heat sink, can be disposed not only on the surface of the side opposite to the second electronic circuit of the first electronic circuit board, but also on the second surface of the substrate according to the present embodiment, which is the second electronic circuit board to more efficiently release the heat generated from the power semiconductor element from both of these surfaces.

Moreover, as mentioned above, in the substrate according to the present embodiment, the level difference(s) are formed so that each terminal of the power semiconductor element and each first surface electrode may be opposed to each other when the power semiconductor element and the substrate are in the relative spatial relationship specified by contact of the lateral face(s) of the power semiconductor element and the lateral face(s) of the level difference(s) at the time of lamination of the first electronic circuit and the second electronic circuit. In order to certainly and easily specify the relative spatial relationship of the power semiconductor element and the substrate according to the present embodiment, which is the second electronic circuit board, by contact of the lateral face(s) of the power semiconductor element and the lateral face(s) of the level difference(s) and accurately align the power semiconductor element and the second electronic circuit board, it is required for the height of the level difference(s) in a direction perpendicular to the first surface to be large to some extent.

On the other hand, when the height of the level difference(s) in a direction perpendicular to the first surface is excessive, there is a possibility that a gap may arise between the surface on the side of the second electronic circuit of the terminal(s) of the power semiconductor element and the first surface electrode(s) which the second electronic circuit board includes, and that it may become difficult to secure the electrical connection between the terminal(s) of the power semiconductor element and the first surface electrode(s). Therefore, in the substrate according to the present embodiment, it is required for the vertical interval (difference in height) in a direction perpendicular to the first surface of the level difference(s) to be within a suitable range.

Namely, the second embodiment of the present invention is;

a substrate according to said first embodiment of the present invention, wherein:

the vertical interval between the higher level of said level difference(s) and said first surface electrode(s) in a direction perpendicular to said first surface is not less than 10 micrometers and not more than the vertical interval between the surface on the side of said second circuit of the terminal(s) of said power semiconductor element and the surface on the side of said second circuit of said first circuit board used for said first circuit in a direction perpendicular to said first surface.

As mentioned above, in the substrate according to the present embodiment, it is desirable that the vertical interval between the higher level of the level difference(s) and the first surface electrode(s) in a direction perpendicular to the first surface (hereinafter, may be simply referred to as "vertical interval of level difference(s)") is not less than 10 micrometers, more preferably not less than 20 micrometers. It is not desirable that the vertical interval of the level difference(s) is less than 10 micrometers, since there is a possibility that it may become difficult to check whether the lateral face(s) (intersecting the surface opposed to the first surface) of the power semiconductor element contacts the lateral face(s) (intersecting the first surface) of the level difference(s) or not, and that it may become difficult to fully bring out the advantage of the present invention that the power semiconductor element and the second electronic circuit board can be easily aligned.

On the other hand, in the substrate according to the present embodiment, it is desirable that the vertical interval of the level difference(s) is not more than the vertical interval between the surface on the side of the second circuit of the terminal(s) of the power semiconductor element and the surface on the side of the second circuit of the first circuit board used for the first circuit in a direction perpendicular to the first surface. It is not desirable that the vertical interval of the level difference(s) exceeds the vertical interval between the surface on the side of the second circuit of the terminal(s) of the power semiconductor element and the surface on the side of the second circuit of the first circuit board used for the first circuit, since there is a possibility that the surface on the side of the second electronic circuit of the terminal(s) of the power semiconductor element cannot contact the first surface electrode(s) which the second electronic circuit board includes and thereby a gap may arise among them and that it may become difficult to secure the electrical connection between the terminal(s) of the power semiconductor element and the first surface electrode(s).

By the way, as mentioned above, the lateral face(s) of the level difference(s) formed at the first surface of the substrate according to the present invention may not necessarily be formed so that it can contact all the lateral faces of the power semiconductor element. For example, when the direction, in which the terminal(s) of the power semiconductor element and the first surface electrode(s) may be misaligned at the time of lamination, is limited to a specific direction, the terminal(s) of the power semiconductor element and the first surface electrode(s) can be prevented from being misaligned by preparing level difference(s) so that the lateral face(s) of the power semiconductor element and the lateral face(s) of the level difference(s) which intersect the direction can contact.

In the case as mentioned above, even if the lateral face(s) of the power semiconductor element and the lateral face(s) of the level difference(s) are formed so that they can contact mutually by point contact or line contact, the power semiconductor element and the substrate according to the present invention can be accurately aligned. However, generally, the terminal(s) of the power semiconductor element and the first surface electrode(s) may be misaligned at the time of lamination in various directions within a plane parallel to the contact surface of the terminal(s) of the power semiconductor element with the first surface electrode(s). Moreover, the terminal(s) of the power semiconductor element and the first surface electrode(s) may be also misaligned at the time of lamination in a rotation direction around an axis perpendicular to the contact surface of the terminal(s) of the power semiconductor element and the first surface electrode(s).

Therefore, in order to accurately and certainly align the power semiconductor element and the substrate according to the present invention, it is desirable to constitute so that the lateral face(s) of the power semiconductor element and the lateral face(s) of the level difference(s) can contact in plural points or lines. More preferably, it is desirable to constitute so that the lateral face(s) of the power semiconductor element and the lateral face(s) of the level difference(s) can contact mutually by face contact.

Therefore, the third embodiment of the present invention is;

a substrate according to any one of said first and second embodiments of the present invention, wherein:

in at least some level difference(s) among said level difference(s), the lateral face(s), which intersects said first surface, of said level difference(s) is formed as a face parallel to the lateral face(s), which intersects the surface opposed to said first surface, of said power semiconductor element.

As mentioned above, in the substrate according to the present embodiment, in at least some level difference(s) among at least one level difference(s) prepared at the first surface, the lateral face(s), which intersects said first surface, of said level difference(s) is formed as a face parallel to the lateral face(s), which intersects the surface opposed to said first surface, of said power semiconductor element. Thereby, in accordance with the substrate according to the present embodiment, the lateral face(s) of the power semiconductor element and the lateral face(s) of the level difference(s) can contact mutually by face contact. Therefore, the power semiconductor element and the substrate according to the present invention can be accurately and certainly aligned.

By the way, as mentioned above, for example, the level difference(s) may be formed by the lateral face(s) (face(s) which intersects the first surface) of the projection(s) prepared at the first surface, may be formed by flange-like structure(s) prepared so as to surround the lateral face(s) of the power semiconductor element at the time of lamination, or may be formed by the depression (concave portion) prepared so that the power semiconductor element might fit into it at the time of lamination. Moreover, such projection(s), flange-like structure(s), and depression can be formed and disposed in a suitable size, form, and a position in accordance with the shape of the power semiconductor element and arrangement thereof in the first electronic circuit, the configuration of the production line which laminates the first electronic circuit and the second electronic circuit, etc.

Furthermore, on the lateral face of the level difference(s) formed by the above-mentioned projection(s), flange-like structure(s), or depression, at least one minute projection may be prepared at least in a region, which is opposed to the lateral face intersecting the surface opposed to said first surface, of the power semiconductor element.

Namely, the fourth embodiment of the present invention is;

a substrate according to any one of said first to third embodiments of the present invention, wherein:

at least one minute projection is prepared at least in a region, which is opposed to said lateral face(s) of said power semiconductor element, of said lateral face(s) of said level difference(s) at the time of lamination of said first electronic circuit and said second electronic circuit, and the relative spatial relationship of said power semiconductor element and said substrate is specified by contact of said lateral face(s) of said power semiconductor element and said minute projection.

As mentioned above, in the substrate according to the present embodiment, at least one minute projection is prepared at least in a region, which is opposed to the lateral face(s) intersecting the surface opposed to the first surface of the power semiconductor element, on the lateral face(s), which intersects the first surface, of the at least level difference(s) prepared at the first surface, at the time of lamination of the first electronic circuit and the second electronic circuit. Since such a configuration can reduce the contact area of the lateral face(s) of the level difference(s) and the lateral face(s) of the power semiconductor element in the substrate according to the present embodiment, for example, as will be mentioned later, the frictional resistance at the time of insertion of the power semiconductor element into the space or depression between level differences, can be reduced, in the embodiment wherein the power semiconductor element is sandwiched among plural level differences, or in the embodiment wherein the power semiconductor element is fitted into the depression (concave portion) demarcated by the lateral face(s) of the level difference(s) and the first surface, at the time of lamination of the first electronic circuit and the second electronic circuit.

By the way, as mentioned above, when the direction, in which the terminal(s) of the power semiconductor element and the first surface electrode(s) may be misaligned at the time of lamination, is limited to one trend in a specific direction, in order to reduce problems, such as increase in the electrical resistance in the junction(s) constituted by the terminal(s) of the power semiconductor element and the first surface electrode(s) and decrease in dielectric strength voltage between adjacent junctions, etc. due to the misalignment of the second electronic circuit board and the power semiconductor element, it is only necessary to prevent the terminal(s) of the power semiconductor element and the first surface electrode(s) from being misaligned to the one trend. Therefore, in such a case, it is only necessary to prepare at least one level difference(s) so as to be able to contact the lateral face oriented to the one trend among the lateral face(s) of the power semiconductor element which intersects the above-mentioned specific direction.

On the other hand, when the terminal(s) of the power semiconductor element and the first surface electrode(s) may be misaligned at the time of lamination not only to the one trend in the above-mentioned specific direction, but also to the other trend (trend contrary to the one trend), in addition to at least one level difference which can contact the lateral face oriented to the one trend among the lateral face(s) of the power semiconductor element intersecting the above-mentioned specific direction, it is necessary to further prepare at least one level difference(s) which can contact the lateral face(s) oriented to the other trend (trend contrary to the one trend). Namely, in such a case, it is necessary to prepare at least two level differences at the first surface of the second electronic circuit board in the above-mentioned specific direction to constitute so that the power semiconductor element may be sandwiched with these level differences at the time of lamination of the first electronic circuit and the second electronic circuit. However, in this case, these at least two level differences may be prepared on the identical line parallel to the above-mentioned specific direction, or may be prepared respectively on the individual lines parallel to the above-mentioned specific direction.

Furthermore, when the direction in which the terminal(s) of the power semiconductor element and the first surface electrode(s) may be misaligned at the time of lamination is not limited to the above-mentioned specific direction (namely, when the terminal(s) of the power semiconductor element and the first surface electrode(s) may be misaligned not only in the above-mentioned specific direction, but also in another direction other than the above-mentioned specific direction, at the time of lamination), by preparing the further level difference(s) so that the lateral face(s) of the power semiconductor element which intersect the another direction other than the above-mentioned specific direction can contact the lateral face(s) of the level difference(s), the misalignment of the terminal(s) of the power semiconductor element and the first surface electrode(s) can be prevented.

Also in the above-mentioned case, when the direction, in which the terminal(s) of the power semiconductor element and the first surface electrode(s) may be misaligned at the time of lamination, is limited to one trend in another direction other than the above-mentioned specific direction, as mentioned above, it is only necessary to prepare at least one level difference(s) so as to be able to contact the lateral face oriented to the one trend among the lateral face(s) of the power semiconductor element which intersects the another direction other than the above-mentioned specific direction.

On the other hand, when the terminal(s) of the power semiconductor element and the first surface electrode(s) may be misaligned at the time of lamination not only to the one trend in the another direction other than the above-mentioned specific direction, but also to the other trend (trend contrary to the one trend), as mentioned above, in addition to at least one level difference which can contact the lateral face oriented to the one trend among the lateral face(s) of the power semiconductor element intersecting the another direction other than the above-mentioned specific direction, it is necessary to further prepare at least one level difference(s) which can contact the lateral face(s) oriented to the other trend (trend contrary to the one trend). Namely, in such a case, it is necessary to prepare at least two level differences at the first surface of the second electronic circuit board in the another direction other than the above-mentioned specific direction to constitute so that the power semiconductor element may be sandwiched with these level differences at the time of lamination of the first electronic circuit and the second electronic circuit. However, in this case, these at least two level differences may be prepared on the identical line parallel to another direction other than the above-mentioned specific direction, or may be prepared respectively on the individual lines parallel to the another direction other than the above-mentioned specific direction.

Therefore, in the above-mentioned case, as a result, it is necessary to prepare at least two (one pair of) level differences at the first surface of the second electronic circuit board, respectively in the above-mentioned specific direction and in the another direction other than the above-mentioned specific direction to constitute so that the power semiconductor element may be surrounded with these at least four (two pairs of) level differences at the time of lamination of the first electronic circuit and the second electronic circuit. In this case, however, the at least two level differences which constitute each pair of these at least two pairs of level differences may be prepared on the identical line parallel to the another direction other than the above-mentioned specific direction, or may be prepared respectively on the individual lines parallel to the another direction other than the above-mentioned specific direction.

The above-mentioned explanation exemplified configurations wherein the power semiconductor element is sandwiched or surrounded by two (one pair of) or four (two pairs of) level differences, as specific examples of techniques for attaining sufficient alignment the second electronic circuit board and the power semiconductor element and preventing misalignment of the terminal(s) of the power semiconductor element and the first surface electrode(s) to reduce the problems, such as increase in the electrical resistance in the junction(s) of the terminal(s) of the power semiconductor element and the first surface electrode(s) of the second electronic circuit board and decrease in the dielectric strength voltage between adjacent junctions, when the direction in which the terminal(s) of the power semiconductor element and the first surface electrode(s) may be misaligned at the time of lamination is not limited to one trend in a specific direction.

However, techniques for attaining sufficient alignment the second electronic circuit board and the power semiconductor element and preventing misalignment of the terminal(s) of the power semiconductor element and the first surface electrode(s) are not limited to the above-mentioned exemplifications. For example, by preparing three level differences at the first surface of the second electronic circuit board and constituting so that the power semiconductor element may be surrounded by these three level differences at the time of lamination of the first electronic circuit and the second electronic circuit, the relative spatial relationship of the power semiconductor element and the second electronic circuit board may be uniquely specified. Alternatively, the relative spatial relationship of the power semiconductor element and the second electronic circuit board may be specified by five or more level differences.

Therefore, the fifth embodiment of the present invention is;
a substrate according to any one of said first to fourth embodiments of the present invention, wherein:
said substrate comprises plural level differences, and
the relative spatial relationship of said power semiconductor element and said substrate is uniquely specified by said plural level differences at the time of lamination of said first electronic circuit and said second electronic circuit.

In the substrate according to the present embodiment, the plural level differences prepared at the first surface may be disposed in a suitable position so that the relative spatial relationship of the power semiconductor element and the second electronic circuit board may be specified uniquely by contact of the lateral face(s) of these plural level difference(s) and the lateral face(s) of the power semiconductor element, at the time of lamination with the first electronic circuit and the second electronic circuit, in accordance with the shape of the power semiconductor element and arrangement thereof in the first electronic circuit, the configuration of the production line which laminates the first electronic circuit and the second electronic circuit, etc.

In a more preferable embodiment, it is desirable to constitute the lateral face(s) of the level difference(s) formed at the first surface of the substrate according to the present invention so as to be able to contact continuously with all the lateral face(s) of the power semiconductor element at the time of lamination of the first electronic circuit and the second electronic circuit.

Namely, the sixth embodiment of the present invention is;
a substrate according to any one of said first to fourth embodiments of the present invention, wherein:
the lateral face(s), which intersects said first surface, of said level difference(s) is formed as a continuous face parallel to all the lateral face(s), which intersects the surface opposed to said first surface, of said power semiconductor element.

As mentioned above, in the substrate according to the present embodiment, the lateral face(s) of the level difference(s) prepared at the first surface, which intersects the first surface, is formed as a continuous face parallel to all the lateral face(s) of the power semiconductor element, which intersects the surface opposed to the first surface. In other words, in accordance with the substrate according to the present embodiment, all the lateral face(s) of the power semiconductor element and the lateral face(s) of the level difference(s) can contact mutually by face contact. Furthermore, in other words, in the substrate according to the present embodiment, the power semiconductor element will be fitted into the depression (concave portion) demarcated by the lateral face(s) of the level difference(s) and the first surface at the time of lamination of the first electronic circuit and the second electronic circuit. Thereby, the relative spatial relationship of the power semiconductor element and the substrate according to the present embodiment, which is the second electronic circuit board, can be uniquely determined at the time of lamination, and therefore the alignment of the power semiconductor element and the second electronic circuit board can be aligned more accurately and certainly.

By the way, in various electronic circuit modules, for the objective of preventing the electrical connections of circuit elements, such as a semiconductor element mounted on a substrate, from fracturing by external force or stress, or corroding with the humidity in ambient environment, it is widely practiced to seal the surroundings of the electrical connections with filler. Moreover, in the high-capacity modules, for the objective of raising the dielectric strength voltage between the electrical connections of the terminal(s) of a power semiconductor element and the electrode(s) of a substrate, it is widely practiced to seal the surroundings of the electrical connections with filler (for example, refer to Patent Literature 4 (PTL 4)). As such filler, for example, resin, glass, etc. can be used. Moreover, as such resin, for example, liquid form hardening resin, such as epoxy resin and polyimide resin, can be used. Furthermore, such resin may be composite resin which contains filler, such as oxidized silicon, etc. In addition, in high-capacity modules, since the increase in temperature by the heat generated from a power semiconductor element is assumed, polyimide resin, glass, etc. which have high heat resistance are desirable as filler.

In addition, unlike the substrate according to the present embodiment, the substrate according to the conventional technology does not include the depression (concave portion) demarcated by the lateral face(s) of level difference(s) and the first surface. Therefore, when sealing the surroundings of the electrical connections of the terminal(s) of a power semiconductor element and the electrode(s) of a substrate with filler as mentioned above, in the high-capacity module using the substrate according to the conventional technology as the second electronic circuit board, not only the surroundings of the electrical connections of the terminal(s) of a power semiconductor element and the electrode(s) of the substrate, but also the entire region which is sandwiched by the substrate of the first electronic circuit and the substrate of the second electronic circuit must be sealed with filler. As a result, in the high-capacity modules using the substrate according to the conventional technology, relatively large volume of filler material is needed.

On the other hand, in the high-capacity modules using the substrate according to the present embodiment as a substrate used for the second electronic circuit, a power semiconductor element is fitted into a depression (concave portion) demarcated by the lateral face(s) of level difference(s) formed at the first surface of the substrate according to the present embodiment and the first surface, as mentioned above. Therefore, by sealing only the gap between the depression and the power semiconductor element with filler, the surroundings of the electrical connections of the terminal(s) of the power semiconductor element and the electrode(s) of the substrate can be sealed. Thereby, the volume of the filler material used for sealing can be reduced and, as a result, the manufacturing cost of a high-capacity module can be reduced. Especially, since polyimide resin having high heat resistance is expensive, the cost reduction effect, which results from the aspect that the substrate according to the present embodiment has a depression demarcated by the lateral face(s) of level difference(s) and the first surface, is large.

By the way, as mentioned above, in the substrates according to the present invention, embodiments wherein the power semiconductor element is sandwiched or surrounded among plural level differences at the time of lamination of the first electronic circuit and the second electronic circuit, or embodiments wherein the power semiconductor element is fitted into a depression (concave portion) demarcated by the lateral face(s) of the level difference(s) and the first surface at the time of lamination of the first electronic circuit and the second electronic circuit may be assumed. In these embodiments, in order to make it easier to fit the power semiconductor element into the space sandwiched or surrounded among plural level differences or into the depression demarcated by the lateral face(s) of the level difference(s) and the first surface, the cross section of such a space or depression by a plane parallel to the first surface may be configured so as to be a little bit larger than the cross section of the power semiconductor element by a plane parallel to the first surface. However, it is desirable that the difference in dimension of the above-mentioned space or depression and the outline of the power semiconductor element is not excessively large to such an extent that it becomes difficult to accurately align the substrate according to the present embodiment and power semiconductor element.

Specifically, it is desirable that the size of the gap between the lateral face(s) of the power semiconductor element and the lateral face(s) of the level difference(s) resulting from the above-mentioned difference in dimension (distance between the lateral face(s) of the power semiconductor element and the lateral face(s) or the projection prepared on the lateral face(s) of the level difference(s), which specifies the relative spatial relationship of the power semiconductor element and the second electronic circuit board at the time of lamination of the first electronic circuit and the second electronic circuit) is not less than 10 micrometers, more preferably not less than 20 micrometers, and is less than 500 micrometers, more preferably less than 100 micrometers. In other words, it is desirable that the size of the gap is not less than 0.1%, more preferably not less than 0.2%, and is less than 10%, more preferably less than 2% of the equivalent circle diameter of the cross section of the power semiconductor element by a plane parallel to the first surface.

Therefore, the seventh embodiment of the present invention is;

a substrate according to any one of said fifth or sixth embodiments of the present invention, wherein:

the distance between said lateral face(s) of said power semiconductor element and said lateral face(s) or said projection prepared on said lateral face(s) of said level difference(s), which specifies the relative spatial relationship of said power semiconductor element and said second electronic circuit board at the time of lamination of said first electronic circuit and said second electronic circuit is not less than 10 micrometers, and is less than 500 micrometers.

As mentioned above, in the substrate according to the present embodiment, the distance between the lateral face(s) of the power semiconductor element, which intersects the surface opposed to the first surface, and the lateral face(s), which intersects the first surface, or the projection prepared on the lateral face(s) of the level difference(s), which specifies the relative spatial relationship of the power semiconductor element and the second electronic circuit board at the time of lamination of the first electronic circuit and the second electronic circuit is not less than 10 micrometers. It is not desirable that the distance is less than 10 micrometers, since it becomes difficult to fit the power semiconductor element into the space sandwiched or surrounded among plural level differences or into the depression demarcated by the lateral face(s) of the level difference(s) and the first surface. More preferably, the distance between the lateral face(s) of the power semiconductor element, which intersects the surface opposed to the first surface, and the lateral face(s), which intersects the first surface, or the projection prepared on the lateral face(s) of the level difference(s), which specifies the relative spatial relationship of the power semiconductor element and the second electronic circuit board at the time of lamination of the first electronic circuit and the second electronic circuit is not less than 20 micrometers.

On the other hand, In the substrate according to the present embodiment, the distance between the lateral face(s) of the power semiconductor element, which intersects the surface opposed to the first surface, and the lateral face(s), which intersects the first surface, or the projection prepared on the lateral face(s) of the level difference(s), which specifies the relative spatial relationship of the power semiconductor element and the second electronic circuit board at the time of lamination of the first electronic circuit and the second electronic circuit is less than 500 micrometers. It is not desirable that the distance is not less than 500 micrometers, since it becomes difficult to accurately align the second electronic circuit board and the power semiconductor element. More preferably, the distance between the lateral face(s) of the power semiconductor element, which intersects the surface opposed to the first surface, and the lateral face(s), which intersects the first surface, or the projection prepared on the lateral face(s) of the level difference(s), which specifies the relative spatial relationship of the power semiconductor element and the second electronic circuit board at the time of lamination of the first electronic circuit and the second electronic circuit is less than 100 micrometers.

Moreover, the eighth embodiment of the present invention is;

a substrate according to any one of said fifth or sixth embodiment of the present invention, wherein:

the distance between said lateral face(s) of said power semiconductor element and said lateral face(s) or said projection prepared on said lateral face(s) of said level difference(s), which specifies the relative spatial relationship of said power semiconductor element and said second electronic circuit board at the time of lamination of said first electronic circuit and said second electronic circuit is not less than 0.1% and less than 10% of the equivalent circle diameter of the cross section of said power semiconductor element by a plane parallel to said first surface.

As mentioned above, in the substrate according to the present embodiment, the distance between said lateral face(s) of said power semiconductor element and said lateral face(s) or said projection prepared on said lateral face(s) of said level difference(s), which specifies the relative spatial relationship of said power semiconductor element and said second electronic circuit board at the time of lamination of said first electronic circuit and said second electronic circuit is not less than 0.1% of the equivalent circle diameter of the cross section of said power semiconductor element by a plane parallel to said first surface. It is not desirable that the distance is less than 0.1% of the equivalent circle diameter, since it becomes difficult to fit the power semiconductor element into the space sandwiched or surrounded among plural level differences or into the depression demarcated by the lateral face(s) of the level difference(s) and the first surface. More preferably, the distance between said lateral face(s) of said power semiconductor element and said lateral face(s) or said projection prepared on said lateral face(s) of said level difference(s), which specifies the relative spatial relationship of said power semiconductor element and said second electronic circuit board at the time of lamination of said first electronic circuit and said second electronic circuit is not less than 0.2% of the equivalent circle diameter of the cross section of said power semiconductor element by a plane parallel to said first surface.

On the other hand, in the substrate according to the present embodiment, the distance between said lateral face(s) of said power semiconductor element and said lateral face(s) or said projection prepared on said lateral face(s) of said level difference(s), which specifies the relative spatial relationship of said power semiconductor element and said second electronic circuit board at the time of lamination of said first electronic circuit and said second electronic circuit is less than 10% of the equivalent circle diameter of the cross section of said power semiconductor element by a plane parallel to said first surface. It is not desirable that the distance is not less than 10% of the equivalent circle diameter, since it becomes difficult to accurately align the second electronic circuit board and the power semiconductor element. More preferably, the distance between said lateral face(s) of said power semiconductor element and said lateral face(s) or said projection prepared on said lateral face(s) of said level difference(s), which specifies the relative spatial relationship of said power semiconductor element and said second electronic circuit board at the time of lamination of said first electronic circuit and said second electronic circuit is less than 2% of the equivalent circle diameter of the cross section of said power semiconductor element by a plane parallel to said first surface.

By the way, as mentioned above, when the various circuit boards which constitute a high-capacity module are laminated to attain reduction in size and weight of the module, the temperature of the high-capacity module may rise remarkably due to the heat generated from a power semiconductor element, such as a switching element. Moreover, also when the electrical connection of the electrode(s) of the peripheral circuit board (the second electronic circuit board) and the terminal(s) of the power semiconductor element is formed, the temperature of the high-capacity module may rise remarkably. In such a case, when materials (for example, resin etc.) which have a large thermal expansion coefficient are used as a base material of the second electronic circuit board, there is a possibility that the difference of the extent of thermal expansion from the power semiconductor element constituted by materials (for example, silicon etc.) which have a comparatively small thermal expansion coefficient may cause problems such as stress acting on the junction(s) of the electrode(s) of the peripheral circuit board (the second electronic circuit board) and the terminal(s) of the power semiconductor element, or decrease in accuracy of alignment of the electrode(s) of the peripheral circuit board (the second electronic circuit board) and the terminal(s) of the power semiconductor element.

On the other hand, in the art, as a loss remedy in power semiconductor elements including IGBT, MOSFET, etc., it has been proposed to use a silicon carbide (SiC) wafer in place of a silicon (Si) wafer which has been conventionally used. The SiC wafer has a feature that the operation at higher temperature is possible as compared with the conventional Si wafer (for example, refer to Non Patent Literature 1 (NPL 1)). Thereby, cooling mechanisms (for example, a heat sink, a water-cooled mechanism, etc.) which are indispensable in power modules which use the conventional Si wafers can be drastically simplified. As a result, reduction in size and weight of high-capacity modules can be attained by using SiC wafers. However, various problems resulting from the heat generated from a power semiconductor element tend to become further severer by increase in operational temperature a power module associated with the use of a SiC wafer.

From the backgrounds as mentioned above, in high-capacity modules, it is desirable that the base material of the second circuit board used for the second electronic circuit laminated through a power semiconductor element on the side, on which the power semiconductor element is disposed, of the first electronic circuit including the power semiconductor element is constituted by material which has a small thermal expansion coefficient. Specifically, it is desirable that the dielectric layer which constitutes the base material of the substrate according to the present invention, which is used as the second electronic circuit board, mainly comprises ceramics.

Therefore, the ninth embodiment of the present invention is;

a substrate according to any one of said first to eighth embodiments of the present invention, wherein:

said dielectric layer mainly comprises ceramics.

As mentioned above, in the substrate according to the present embodiment, the dielectric layer which constitutes the base material of the substrate mainly comprises ceramics. Ceramics is a material which has a smaller thermal expansion coefficient as compared with the base material of the conventional substrates, such as resin, etc. Therefore, in the substrate according to the present embodiment, as mentioned above, even when the temperature of the high-capacity module using the substrate rises remarkably, the difference of the extent of its thermal expansion from that of a power semiconductor element is prevented from becoming excessive. As a result, in accordance with the substrate according to the present embodiment, problems such as stress acting on the junction(s) of the electrode(s) of the peripheral circuit board (the second electronic circuit board) and the terminal(s) of the power semiconductor element, or decrease in accuracy of alignment of the electrode(s) of the peripheral circuit board (the second electronic circuit board) and the terminal(s) of the power semiconductor element can be reduced.

By the way, the method for manufacturing the substrate according to the present embodiment may be any kind of method as long as the above-mentioned requirements are satisfied, and can be properly chosen from various methods used for manufacturing the substrate made of ceramics in the art. As a specific example of the method for manufacturing the substrate according to the present embodiment, for example, what is called a "gel-cast method" and a "doctor blade method", etc. can be exemplified.

When adopting the above-described gel-cast method, the substrate according to the present embodiment can be obtained, for example, by disposing a conductive pattern on the surface of a film-like or sheet-like protective backing material by a printing method, such as a screen printing method, etc., injecting a slurry of dielectric materials, such as ceramics, into the portion in which the conductive pattern is not disposed, laminating required number of sheets of dielectric material with the conductive pattern embedded therein, which is obtained by solidifying the slurry to constitute the conductive pattern as surface electrode(s) or inner layer electrode(s), and calcinating the same.

As the above-mentioned protective backing material, it is desirable to use resin films, such as a polyethylene terephthalate (PET) film, a polyethylene naphthalate (PEN) film and, besides resin films, various film-like or sheet-like materials, such as a glass board, paper, or metal, can be used. However, as protective backing material, it is preferable to use those with flexibility from a viewpoint of the ease of peel-off operation.

Moreover, for the objective of enabling it to easily peel off the sheet of the dielectric material from the protective backing material, etc., for example, a release agent etc. may be applied to the surface of the above-mentioned protective backing material. Such a release agent includes, for example, various agents known as mold lubricant in the art. More specifically, as such a release agent, well-known silicone series release agents, fluorine system release agents, and etc. can be used.

It is desirable that the above-mentioned conductive pattern is disposed by forming the conductive paste which comprises, as the main ingredients, at least one or more kinds of metal chosen from, for example, gold, silver, copper, etc. and a thermosetting resin precursor on the surface of the above-mentioned protective backing material, by methods, such as screen printing, etc. As such a thermosetting resin precursor, phenol resin, resole resin, urethane resin, epoxy resin, melamine resin, etc. can be used. Among these, phenol resin and resole resin are especially preferable. After printing such conductive paste on the surface of the above-mentioned protective backing material, a conductive pattern can be obtained by hardening the binder contained in the conductive paste.

As the slurry of the above-mentioned dielectric material, for example, slurry which comprises resin, ceramic powder, and a solvent can be exemplified. In this case, resin can function as what is called a "binder" and, for example, thermosetting resin, such as phenol resin, resole resin, or polyurethane resin, or a polyurethane precursor which comprise or polyol and polyisocyanate can be used. Among these, the thermosetting resin precursor that comprises polyol and polyisocyanate is especially preferable.

As a ceramic material used as ceramic powder, any of oxide system ceramics or non-oxide system ceramics can be used. For example, alumina ($Al_2O_3$), zirconia ($ZrO_2$), barium titanate ($BaTiO_3$), silicon nitride ($Si_3N_4$), silicon carbide (SiC), barium oxide (BaO), titanium oxide ($TiO_2$), oxidized silicon ($SiO_2$), zinc oxide ($ZnO_2$), neodymium oxide ($Nd_2O_3$), etc. can be used. Moreover, these materials may be used solely or in combination of two or more kinds thereof. Furthermore, as long as slurry can be prepared, the particle size of ceramic material is not particularly limited.

Moreover, the above-mentioned solvent is not particularly limited, as long as it can dissolve resin as the above-mentioned binder (and a dispersing agent, when used). As a specific example of the solvent, the solvent which has two or more ester bonds, such as polybasic acid ester (for example, dimethyl glutarate, etc.) and acid ester of polyhydric alcohol (for example, triacetin (glyceryl triacetate) etc.), etc, can be exemplified.

Furthermore, the slurry of the above-mentioned dielectric material may contain a dispersing agent in addition to above-mentioned resin, ceramic powder, and solvent. As a specific example of a dispersing agent, for example, polycarboxylic acid system copolymers, polycarboxylic acid salts, etc. can be exemplified. By adding such a dispersing agent, the slurry before molding can have low viscosity and high flowability.

By the way, as mentioned above, the present invention relates to a circuit board for the peripheral circuits of a high-capacity module. More particularly, the present invention relates to a circuit board for the peripheral circuits laminated with a circuit including a power semiconductor element, for example, in high-capacity modules including power modules, such as an inverter used in a hybrid vehicle or an electric vehicle. Furthermore, the present invention relates also to a high-capacity module including a peripheral circuit which uses the circuit board.

Herein, as mentioned above, a high-capacity module refers to the module handling large electric power including power modules, such as an inverter. In such high-capacity modules, as mentioned above, demand for reduction in size and weight and higher efficiency increasingly becomes stronger than before, for example, along with the popularization of hybrid vehicles and of electric vehicles etc.

In order to meet the above-mentioned demand, in the peripheral circuit included in a high-capacity module, it is desirable to use the substrate according to the present invention. Thereby, when the various circuit boards which constitute a high-capacity module are laminated for reduction in size and weight of the module, the terminal(s) of a power semiconductor element and the surface electrode(s) or leadframe terminal(s) of a wiring board can be accurately aligned in the junction(s) constituted by the terminal(s) of the power semiconductor element and the surface electrode(s) or leadframe terminal(s) of the wiring board to reduce problems such as increase in electrical resistance in the junction(s) constituted by the terminal(s) of the power semiconductor element and the surface electrode(s) or leadframe terminal(s) of the wiring board, or insufficient dielectric strength voltage between adjacent junctions. Therefore, the high-capacity module including a peripheral circuit using the substrate according to the various above-mentioned embodiments and other various modifications of the present invention is also involved in the scope of the present invention.

Namely, the tenth embodiment of the present invention is a high-capacity module which comprises:

a first electronic circuit including a power semiconductor element, and a second electronic circuit laminated on the side, on which said power semiconductor element is disposed, of said first electronic circuit, via said power semiconductor element, wherein:

a substrate, which is a second electronic circuit board used for said second electronic circuit, comprises a base material which comprises a dielectric layer, inner layer electrode(s) embedded inside of said base material, first surface electrode(s) formed at a first surface that is the surface on the side of said first electronic circuit of said substrate, and at least one level difference(s) prepared at said first surface, the thickness of at least a part of said inner layer electrode(s) and said first surface electrode(s) is not less than 50 micrometers in a direction perpendicular to said first surface, and said level difference(s) are formed so that each of said terminal(s) of said power semiconductor element and each of said first surface electrode(s) may be opposed to each other, when said power semiconductor element and said substrate are in the relative positional relationship specified by contact of the lateral face(s), which intersects the surface opposed to said first surface, of said power semiconductor element with the lateral face(s), which intersects said first surface, of said level difference(s) at the time of lamination of said first electronic circuit and said second electronic circuit.

Moreover, the eleventh embodiment of the present invention is;

a high-capacity module according to said tenth embodiment of the present invention, wherein:

the vertical interval between the higher level of said level difference(s) and said first surface electrode(s) in a direction perpendicular to said first surface is not less than 10 micrometers and not more than the vertical interval between the surface on the side of said second circuit of the terminal(s) of said power semiconductor element and the surface on the side of said second circuit of said first circuit board used for said first circuit in a direction perpendicular to said first surface.

Furthermore, the twelfth embodiment of the present invention is;

a high-capacity module according to any one of said tenth or eleventh embodiment of the present invention, wherein:

in at least some level difference(s) among said level difference(s), the lateral face(s), which intersects said first surface, of said level difference(s) is formed as a face parallel to the lateral face(s), which intersects the surface opposed to said first surface, of said power semiconductor element.

In addition, the thirteenth embodiment of the present invention is;

a high-capacity module according to any one of said tenth to twelfth embodiments of the present invention, wherein:

at least one minute projection is prepared at least in a region, which is opposed to said lateral face(s) of said power semiconductor element, of said lateral face(s) of said level difference(s) at the time of lamination of said first electronic circuit and said second electronic circuit, and the relative spatial relationship of said power semiconductor element and said substrate is specified by contact of said lateral face(s) of said power semiconductor element and said minute projection.

As mentioned above, in the high-capacity module according to the present embodiment, at least one minute projection is prepared at least in a region, which is opposed to the lateral face(s) intersecting the surface opposed to the first surface of the power semiconductor element, on the lateral face(s), which intersects the first surface, of the at least level difference(s) prepared at the first surface, at the time of lamination of the first electronic circuit and the second electronic circuit. Since such a configuration can reduce the contact area of the lateral face(s) of the level difference(s) and the lateral face(s) of the power semiconductor element in the substrate according to the present embodiment, for example, as will be mentioned later, the frictional resistance at the time of insertion of the power semiconductor element into the space or depression between level differences, can be reduced, in the embodiment wherein the power semiconductor element is sandwiched among plural level differences, or in the embodiment wherein the power semiconductor element is fitted into the depression (concave portion) demarcated by the lateral face(s) of the level difference(s) and the first surface, at the time of lamination of the first electronic circuit and the second electronic circuit. In addition, the position of the power semiconductor element in the space among the level differences or depression can be further accurately and certainly fixed.

Furthermore, in the embodiment wherein the power semiconductor element is fitted into the depression (concave portion) demarcated by the lateral face(s) of the level difference(s) and the first surface, as mentioned above, the surroundings of the electrical connections of the terminal(s) of the power semiconductor element and the first surface electrode(s) of the second electronic circuit board can be sealed with filler to prevent the electrical connections from fracturing by external force or stress, or corroding with the humidity in ambient environment. In such a case, in accordance with the high-capacity module according to the present embodiment, the gap between the depression, which is demarcated by the lateral face(s) of the level difference(s) and the first surface, and the power semiconductor element can be certainly and uniformly secured by the minute projection prepared at the lateral face(s) of the level difference(s).

Moreover, the fourteenth embodiment of the present invention is;

a high-capacity module according to any one of said tenth to thirteenth embodiments of the present invention, wherein:

said substrate comprises plural level differences, and the relative spatial relationship of said power semiconductor element and said substrate is uniquely specified by said plural level differences at the time of lamination of said first electronic circuit and said second electronic circuit.

Furthermore, the fifteenth embodiment of the present invention is;

a high-capacity module according to any one of said tenth to thirteenth embodiments of the present invention, wherein:

the lateral face(s), which intersects said first surface, of said level difference(s) is formed as a continuous face parallel to all the lateral face(s), which intersects the surface opposed to said first surface, of said power semiconductor element.

By the way, as mentioned above, in the high-capacity module according to the present embodiment, the lateral face(s) of the level difference(s) prepared at the first surface, which intersects the first surface, is formed as a continuous face parallel to all the lateral face(s) of the power semiconductor element, which intersects the surface opposed to the first surface. In other words, in the high-capacity module according to the present embodiment, the power semiconductor element is fitted into the depression (concave portion) demarcated by the lateral face(s) of the level difference(s) and the first surface. Therefore, by sealing only the gap between the depression and the power semiconductor element with filler, the surroundings of the electrical connections of the terminal(s) of the power semiconductor element and the electrode(s) of the substrate can be sealed. Thereby, the volume of the filler material used for sealing can be reduced and, as a result, the manufacturing cost of a high-capacity module can be reduced. Especially, since polyimide resin having high heat resistance is expensive, the cost reduction effect, which results from the aspect that the second electronic circuit board used for the high-capacity module according to the present embodiment has a depression demarcated by the lateral face(s) of level difference(s) and the first surface, is large.

Therefore, the sixteenth embodiment of the present invention is;

a high-capacity module according to the fifteenth embodiment of the present invention, wherein:

the gap between the depression demarcated by the lateral face(s), which intersects said first surface, of said level difference(s) and said first surface, and the surface opposed to said first surface and the lateral face(s), which intersects the surface, of said power semiconductor element fitted into the depression is filled up with insulating material.

Moreover, the seventeenth embodiment of the present invention is;

a high-capacity module according to any one of said fourteenth or fifteenth embodiment of the present invention, wherein:

the distance between said lateral face(s) of said power semiconductor element and said lateral face(s) or said projection prepared on said lateral face(s) of said level difference(s), which specifies the relative spatial relationship of said power semiconductor element and said second electronic circuit board at the time of lamination of said first electronic circuit and said second electronic circuit is not less than 10 micrometers, and is less than 500 micrometers.

Moreover, the eighteenth embodiment of the present invention is;

a high-capacity module according to any one of said fourteenth or fifteenth embodiment of the present invention, wherein:

the distance between said lateral face(s) of said power semiconductor element and said lateral face(s) or said projection prepared on said lateral face(s) of said level difference(s), which specifies the relative spatial relationship of said power semiconductor element and said second electronic circuit board at the time of lamination of said first electronic circuit and said second electronic circuit is not less than 0.1% and less than 10% of the equivalent circle diameter of the cross section of said power semiconductor element by a plane parallel to said first surface.

In addition, the nineteenth embodiment of the present invention is;

a high-capacity module according to any one of said tenth to eighteenth embodiments of the present invention, wherein:

said dielectric layer mainly comprises ceramics.

Hereafter, referring to an accompanying drawing etc., the configurations of the substrates and high-capacity modules according to some embodiments of the present invention, etc. will be explained. However, the explanation which will be described below is provided only for the purpose of exemplification, and the scope of the present invention should not be interpreted as to be limited to the following explanation.

Example 1

Configuration of Substrate According to Embodiment of Present Invention and High-Capacity Module Including the Substrate As mentioned above, FIG. 1 is a schematic view showing the configuration of a substrate, which has level differences formed by depressions (concave portions) prepared at the first surface, according to one embodiment of the present invention, and a high-capacity module including the substrate. As shown in FIG. 1, in the high-capacity module according to the present example, the level difference 11 is formed by the depression (concave portion) prepared at the first surface of the second electronic circuit board 10 that is a substrate according to one embodiment of the present invention. Moreover, the second electronic circuit board 10 comprises the base material 14 which consists of dielectric layer(s), the inner layer electrode 15 embedded inside of the base material 14, and the first surface electrode 16 formed at the first surface that is the surface on the side of the first electronic circuit of the substrate. In the present example, the first surface electrode 16 is embedded inside of the base material 14, and the face which is opposed to the terminal of the power semiconductor element 21 is exposed at the first surface.

The three circuit elements 12 are disposed on the second surface that is the surface on the side opposite to in the first surface electrode 16 of the second electronic circuit board 10. The circuit element 12 is electrically connected with the first surface electrode 16 through the inner layer electrode 15 embedded inside of the base material 14 of the second electronic circuit board 10. On the other hand, on the surface on the side opposite to the surface where the power semiconductor element 21 is disposed of the first electronic circuit board 20, the heat sink 22 for releasing the heat generated from the power semiconductor element 21 is prepared. Furthermore, the case 30 which connects the heat sink 22 and the second electronic circuit board 10 is formed around the outer edge part of the heat sink 22 and the second electronic circuit board 10.

The first surface electrode 16 is disposed on the bottom face of the depression (concave portion) which forms the level difference 11 so as to be opposed to the terminal of the power semiconductor element 21 in the state where the second electronic circuit board 10 and the power semiconductor element 21 is aligned by fitting the power semiconductor element 21 disposed on the first electronic circuit board 20 into the depression (concave portion) which forms the level difference 11 at the time of lamination of the first electronic circuit board 20 and the second electronic circuit board 10. In the high-capacity module according to the present example, by such a configuration, the second electronic circuit board 10 and the power semiconductor element 21 can be accurately and easily aligned. That is, in the high-capacity module according to the present example, the first surface electrode 16 of the second electronic circuit board 10 and the terminal of the power semiconductor element 21 can be aligned more accurately. As a result, in the high-capacity module according to the present example, problems, such as increase in the electrical resistance in the junction of the terminal of the power semiconductor element 21 and the first surface electrode 16 of the second electronic circuit board 10 and decrease in the dielectric strength voltage between adjacent junctions, can be reduced.

Example 2

Figure 2:
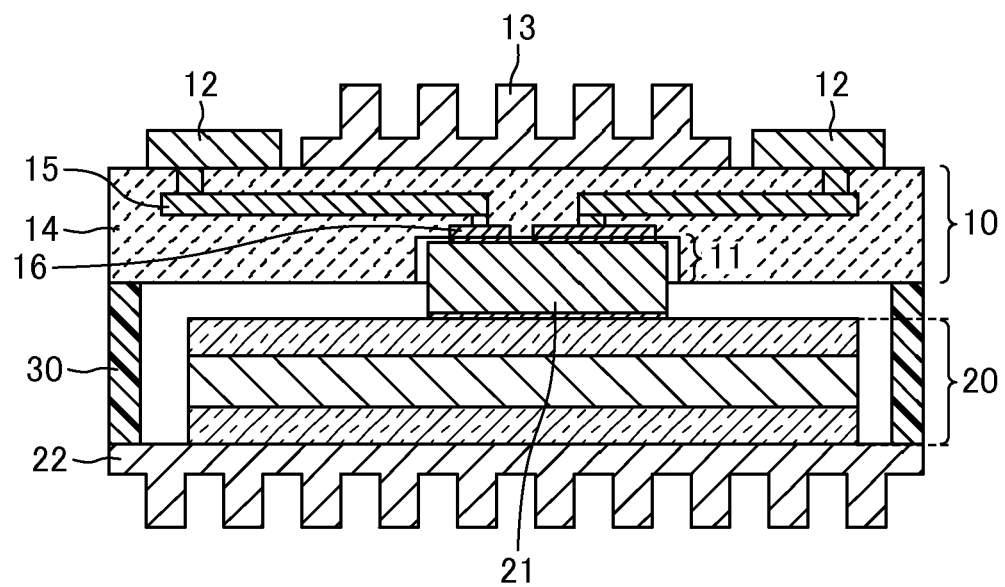
FIG. 2 A schematic view showing the configuration of a substrate, in which a heat sink is disposed on the second electronic circuit board, according to one modification of the embodiment shown in FIG. 1, and a high-capacity module including the substrate.

Configuration of Substrate According to Embodiment of Present Invention and High-capacity Module Including the Substrate As mentioned above, FIG. 2 is a schematic view showing the configuration of a substrate, in which a heat sink is disposed on the second electronic circuit board, according to one modification of the embodiment shown in FIG. 1, and a high-capacity module including the substrate. As shown in FIG. 2, the high-capacity module according to the present example has the same configuration as the high-capacity module shown in FIG. 1, except for the point that the central circuit element 12 among the three circuit elements 12 disposed on the second surface of the second electronic circuit board 10 is replaced with the heat sink 13.

In the high-capacity module according to the present example, the heat generated from the power semiconductor element 21 can be efficiently transmitted to the heat sink 13 disposed on the second surface side of the second electronic circuit board 10, since the terminal of the power semiconductor element 21 and the first surface electrode 16 are directly connected not through a wire etc. Therefore, in the high-capacity module using the substrate according to the present example, the heat sinks 22 and 13 are disposed respectively on the surface on the side opposite to the second electronic circuit of the first electronic circuit board 20 and the second surface of the second electronic circuit board 10, and through both of these heat sinks, the heat generated from the power semiconductor element 21 I can be released more efficiently.

Example 3

Figure 3:
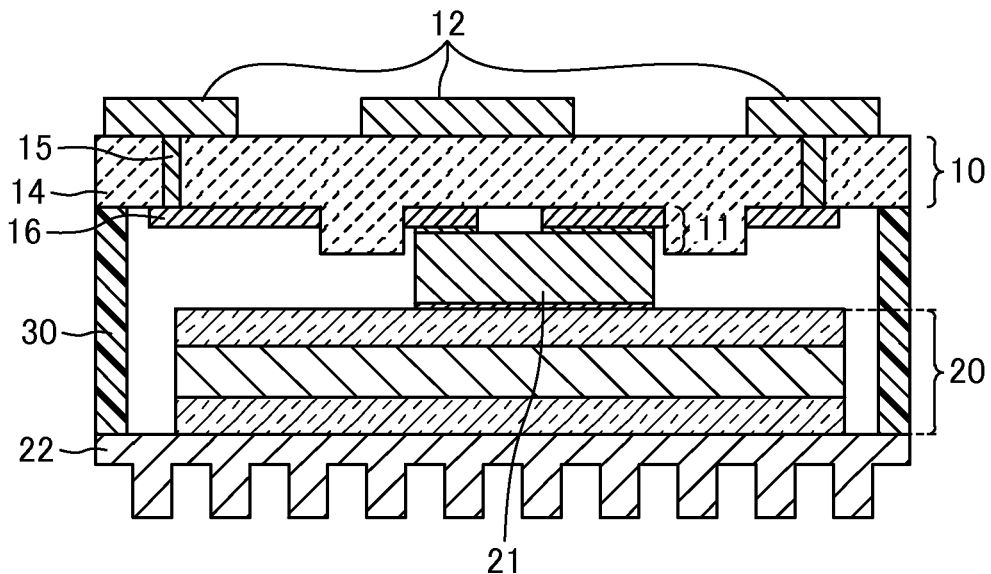
FIG. 3 A schematic view showing the configuration of a substrate, which has level differences formed by projections prepared at the first surface, according to one embodiment of the present invention, and a high-capacity module including the substrate.

Configuration of Substrate According to Embodiment of Present Invention and High-capacity Module Including the Substrate As mentioned above, FIG. 3 is a schematic view showing the configuration of a substrate, which has level differences formed by projections prepared at the first surface, according to one embodiment of the present invention, and a high-capacity module including the substrate. As shown in FIG. 3, the high-capacity module according to the present example has the same configuration as the high-capacity module shown in FIG. 1, except for the point that the level difference 11 is formed by the projection prepared at the first surface and the point that the first surface electrode 16 is disposed on the first surface of the second electronic circuit board 10 (not embedded inside of the base material 14).

Also in the high-capacity module according to the present example, similarly to the embodiment shown in FIG. 1, the second electronic circuit board 10 and the power semiconductor element 21 are aligned by fitting the power semiconductor element 21 between the projections which form the level difference 11. Thereby, in the high-capacity module according to the present example, the second electronic circuit board 10 and the power semiconductor element 21 can be accurately and easily aligned. That is, in the high-capacity module according to the present example, the first surface electrode 16 of the second electronic circuit board 10 and the terminal of the power semiconductor element 21 can be aligned more accurately. As a result, in the high-capacity module according to the present example, problems, such as increase in the electrical resistance in the junction of the terminal of the power semiconductor element 21 and the first surface electrode 16 of the second electronic circuit board 10 and decrease in the dielectric strength voltage between adjacent junctions, can be reduced.

Example 4

Figure 4:
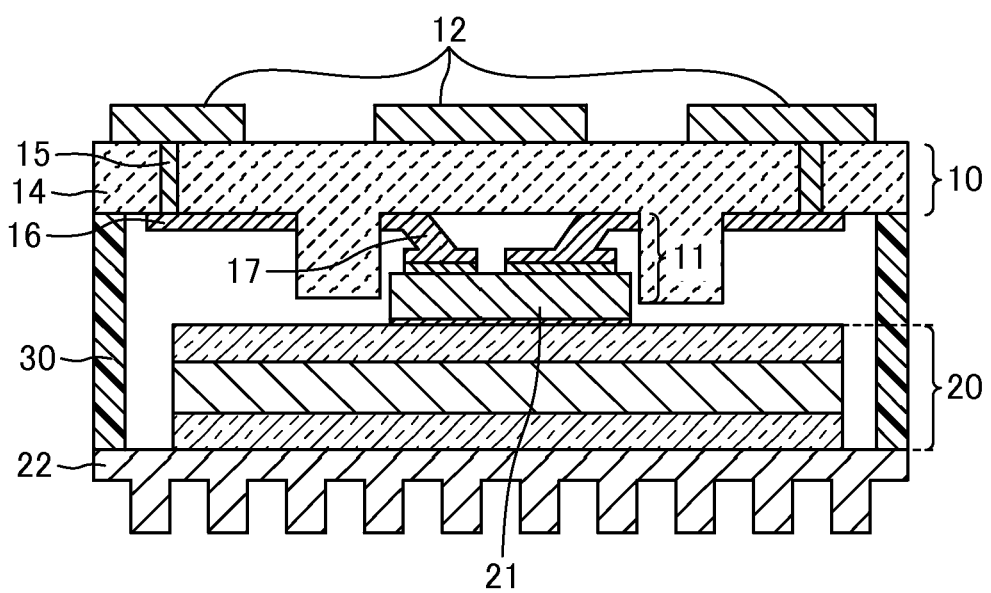
FIG. 4 A schematic view showing the configuration of a substrate, in which the first surface electrodes are formed by leadframes, according to one modification of the embodiment shown in FIG. 3, and a high-capacity module including the substrate.

Configuration of Substrate According to Embodiment of Present Invention and High-capacity Module Including the Substrate As mentioned above, FIG. 4 is a schematic view showing the configuration of a substrate, in which the first surface electrodes are formed by leadframes, according to one modification of the embodiment shown in FIG. 3, and a high-capacity module including the substrate. As shown in FIG. 4, the high-capacity module has the same configuration as the high-capacity module shown in FIG. 3, except for the point that the first surface electrode 16 is replaced with the leadframe 17 disposed on the first surface of the second electronic circuit board 10, and the point that the height (vertical interval) of the projection which forms the level difference 11 is larger.

In the high-capacity module according to the present example, the first surface electrode 16 is replaced with the leadframe 17 (the leadframe 17 constitutes the first surface electrode 16) and the contact surface with the terminal of the power semiconductor element 21 considerably projects from the first surface of the second electronic circuit board 10. Therefore, in order to accurately and easily align the second electronic circuit board 10 and the power semiconductor element 21, it is desirable to increase the height (vertical interval) of the projection which forms the level difference 11, as in the high-capacity module according to the present example.

Comparative Example 1

Figure 5:
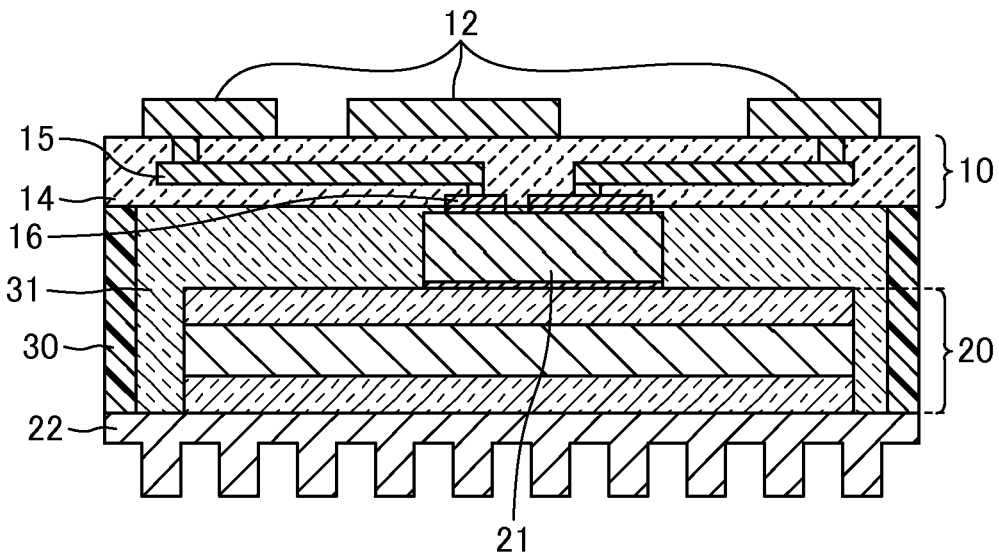
FIG. 5 A schematic view showing the filling situation of filler in a high-capacity module using a substrate according to a conventional technology as a peripheral circuit board (the second electronic circuit board).

Configuration of Substrate According to Conventional Technology and High-capacity Module Including the Substrate As mentioned above, FIG. 5 is a schematic view showing the filling situation of filler in a high-capacity module using a substrate according to a conventional technology as a peripheral circuit board (the second electronic circuit board). As shown in FIG. 5, the level difference 11 is not formed in the substrate according to the conventional technology. Therefore, unlike the substrate according to the present invention, the substrate according to the conventional technology cannot accurately and easily align the second electronic circuit board 10 and the power semiconductor element 21. As a result, in the high-capacity module according to the present comparative example, there is a possibility that problems, such as increase in the electrical resistance in the junction of the terminal of the power semiconductor element 21 and the first surface electrode 16 of the second electronic circuit board 10 and decrease in the dielectric strength voltage between adjacent junctions, resulting from the insufficient alignment of the second electronic circuit board 10 and the power semiconductor element 21, may arise.

Moreover, the substrate according to the conventional technology, which is used as the second electronic circuit board 10 in the high-capacity module according to the present comparative example, does not include the depression (concave portion) into which the power semiconductor element 21 is fitted at the time of lamination with the first electronic circuit board 20. Therefore, when as mentioned above, for the objective of prevention of fracture and corrosion of the electrical connections of the first surface electrode 16 of the second electronic circuit board 10 and the terminal of the power semiconductor element 21, the surroundings of the electrical connections are to be sealed with filler, all the whole gap involved in the region surrounded by the second electronic circuit board 10, the first electronic circuit board 20, and the case 30 must be sealed with the filler 31, as shown in FIG. 5. As a result, in the high-capacity module according to the present comparative example, which uses the substrate according to the conventional technology, relatively large volume of filler material is needed.

Example 5

Figure 6:
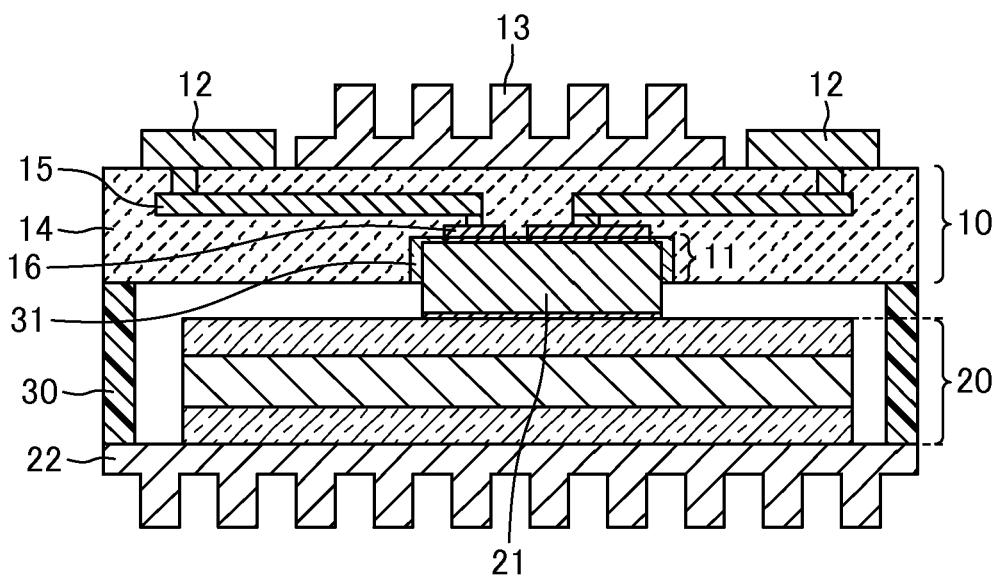
FIG. 6 A schematic view showing the filling situation of filler in a high-capacity module using the substrate according to one embodiment of the present invention as a peripheral circuit board (the second electronic circuit board).

Configuration of Substrate According to Embodiment of Present Invention and High-capacity Module Including the Substrate As mentioned above, FIG. 6 is a schematic view showing the filling situation of filler in a high-capacity module using the substrate according to one embodiment of the present invention as a peripheral circuit board (the second electronic circuit board). As shown in FIG. 6, the high-capacity module according to the present example has the same configuration as the high-capacity module shown in FIG. 2, except for the point that the gap between the inner wall surface of the depression (concave portion) which is prepared at the first surface of the second electronic circuit board 10 and forms the level difference 11 and the outer wall surface of the power semiconductor element 21 which is fitted into the depression (concave portion) is filled with the filler 31.

As shown in FIG. 6, in the high-capacity module according to the present example, which uses the substrate according to one embodiment of the present invention as the second electronic circuit board 10, unlike the high-capacity module according to the above-mentioned Comparative Example 1, the surroundings of the electrical junctions of the terminal of the power semiconductor element 21 and the first surface electrode 16 of the second electronic circuit board 10 can be sealed by filling only the gap between the depression (concave portion) formed at the first surface of the second electronic circuit board 10 and the power semiconductor element 21 with the filler 31. Thereby, the volume of the filler 31 used for sealing can be reduced and, as a result, the manufacturing cost of the high-capacity module can be reduced.

Example 6

Configuration of Substrate According to Embodiment of Present Invention and High-capacity Module Including the Substrate As mentioned above, FIG. 7 is a schematic view showing the fitting situation of a power semiconductor element into a depression (concave portion) prepared at the first surface of the second electronic circuit board in high-capacity modules using the substrates according to one embodiments of the present invention as peripheral circuit boards (the second electronic circuit boards). More particularly, FIG. 7 (a) is a transverse cross section by line A-A' of the high-capacity module shown in FIG. 1. Moreover, FIG. 7 (b) is a transverse cross section of the high-capacity module including the substrate according to one embodiment of the present invention which has a projection at the lateral face of the level difference formed by the depression prepared at the first surface of the second electronic circuit board. In addition, in FIG. 7, the inner layer electrode embedded inside of the second electronic circuit board 10 is omitted in both of (a) and (b).

Figure 7:
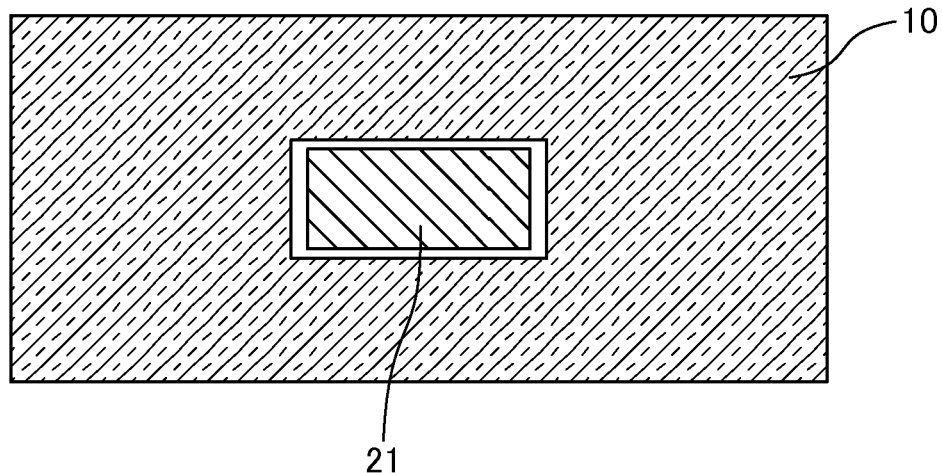
FIG. 7 A schematic view showing the fitting situation of a power semiconductor element into a depression (concave portion) prepared at the first surface of the second electronic circuit board in high-capacity modules using the substrates according to one embodiments of the present invention as peripheral circuit boards (the second electronic circuit boards).
Figure 7:
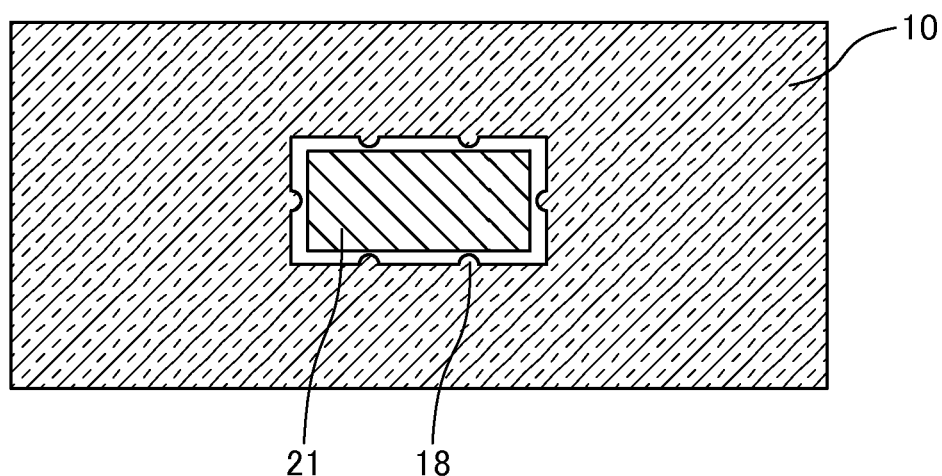

In the high-capacity module according to the example shown in FIG. 7 (a), the power semiconductor element 21 is fitted into the depression demarcated by the level differences prepared at the first surface of the second electronic circuit board 10. In the present example, in order to make it easy to fit the power semiconductor element 21 into the depression demarcated by the level differences prepared at the first surface of the second electronic circuit board 10, the cross section by a plane parallel to the first surface of the depression is constituted so as to be slightly larger than the cross section by a plane parallel to the first surface of the power semiconductor element 21. As mentioned above, the size of the gap between the lateral face of the power semiconductor element 21 and the lateral face of the level difference in the present example is not less than 10 micrometers, more preferably not less than 20 micrometers, and is less than 500 micrometers, more preferably less than 500 micrometers. In other words, the size of the gap is not less than 0.1%, more preferably not less than 0.2%, and is less than 10%, more preferably less than 2% of the equivalent circle diameter of the cross section by a plane parallel to the first surface of the power semiconductor element 21.

On the other hand, in the high-capacity module according to the example shown in FIG. 7 (b), the power semiconductor element 21 is fitted into the space demarcated by the plural minute projections 18 prepared on the lateral faces of the level differences prepared at the first surface of the second electronic circuit board 10. In the present example, in order to make it easy to fit the power semiconductor element 21 into the space demarcated by the minute projections 18 prepared on the lateral faces of the level differences prepared in the first surface of the second electronic circuit board 10, the cross section by a plane parallel to the first surface of the space is constituted so as to be slightly larger than the cross section by a plane parallel to the first surface of the power semiconductor element 21. In the present example, as mentioned above, the size of the gap between the minute projections 18 prepared on the lateral faces of the level differences and the lateral faces of the power semiconductor element 21 is not less than 10 micrometers, more preferably not less than 20 micrometers, and is less than 500 micrometers, more preferably less than 100 micrometers. In other words, the size of the gap is not less than 0.1%, more preferably not less than 0.2%, and less than 10%, more preferably less than 2% of the equivalent circle diameter of the cross section by a plane parallel to the first surface of the power semiconductor element 21.

In the high-capacity modules according to any of the examples shown in FIGS. 7 (a) and (b), the power semiconductor element 21 is fitted into the depression demarcated by the level differences prepared at the first surface of the second electronic circuit board 10 or the space demarcated by the plural minute projections 18 prepared on the lateral faces of the level differences prepared at the first surface of the second electronic circuit board 10, and thereby the second electronic circuit board 10 and the power semiconductor element 21 is accurately and certainly aligned. Thereby, also in the high-capacity modules according to these examples, the second electronic circuit board and the power semiconductor element 21 can be accurately and easily aligned. As a result, in the high-capacity modules according to these examples, problems, such as increase in the electrical resistance in the junction of the terminal of the power semiconductor element 21 and the first surface electrode of the second electronic circuit board 10 and decrease in the dielectric strength voltage between adjacent junctions, can be reduced.

Moreover, in the high-capacity module according to the example shown in FIG. 7 (b), since the contact area of the power semiconductor element 21 and the second electronic circuit board 10 is reduced at the time of lamination of the first electronic circuit and the second electronic circuit by the plural minute projections 18 prepared on the lateral faces of the level differences prepared at the first surface of the second electronic circuit board 10, the frictional resistance at the time of insertion of the power semiconductor element 21 into the second electronic circuit board 10 can be reduced.

Although some embodiments with specific configurations have been explained above for the objective of explaining the present invention, it is needless to say that the scope of the present invention is not limited to these exemplary embodiments, various modifications can be properly added thereto within the limits of the matter described in the claims and specification.

REFERENCE SIGNS LIST

10: second electronic circuit board,
11: level difference,
12: circuit element,
13: heat sink,
14: base material,
15: inside layer electrode,
16: first surface electrode,
17: leadframe,
18: minute projection,
20: first electronic circuit board,
21: power semiconductor element,
22: heat sink,
30: case, and
31: filler.

The invention claimed is:

1. A substrate which is a second electronic circuit board used for a second electronic circuit laminated on a side of a first electronic circuit including a power semiconductor element, on which said power semiconductor element is disposed, via said power semiconductor element, wherein:
said substrate comprises a base material which comprises a dielectric layer, at least one inner layer electrode embedded inside of said base material, at least one first surface electrode formed at a first surface that is a surface on a side facing said first electronic circuit of said substrate, and at least one level difference prepared at said first surface, a thickness of at least a part of said inner layer electrode and said first surface electrode is not less than 50 micrometers in a direction perpendicular to said first surface, and said level difference is formed so that a terminal of said power semiconductor element and said first surface electrode are opposed to each other, when said power semiconductor element and said substrate are in a relative positional relationship specified by contact of at least one lateral face of said power semiconductor element, which intersects the surface opposed to said first surface, with at least one lateral face of said level difference, which intersects said first surface, at the time of lamination of said first electronic circuit and said second electronic circuit, wherein said dielectric layer mainly comprises ceramics.

2. A substrate according to claim 1, wherein:
a vertical interval between the higher level of said level difference and said first surface electrode in a direction perpendicular to said first surface is not less than 10 micrometers and not more than the vertical interval between the surface on the side of said second circuit of the terminal of said power semiconductor element and the surface on the side of said second circuit of said first electronic circuit used for said first circuit in a direction perpendicular to said first surface.

3. A substrate according to claim 1, wherein:
in at least one level difference, the lateral face of said level difference, which intersects said first surface, is formed as a face parallel to the lateral face of said power semiconductor element, which intersects the surface opposed to said first surface.

4. A substrate according to claim 1, wherein:
at least one minute projection is prepared at least in a region, which is opposed to said lateral face of said power semiconductor element, of said lateral face of said level difference at the time of lamination of said first electronic circuit and said second electronic circuit, and the relative spatial relationship of said power semiconductor element and said substrate is specified by contact of said lateral face of said power semiconductor element and said minute projection.

5. A substrate according to claim 1, wherein:
said substrate comprises plural level differences, and
a relative spatial relationship of said power semiconductor element and said substrate is uniquely specified by said plural level differences at the time of lamination of said first electronic circuit and said second electronic circuit.

6. A substrate according to claim 1, wherein:
the lateral face, which intersects said first surface, of said level difference is formed as a continuous face parallel to all the lateral faces, which intersects the surface opposed to said first surface, of said power semiconductor element.

7. A substrate according to claim 4, wherein:
a distance between said lateral face of said power semiconductor element and said lateral face of said level difference or a distance between said lateral face of said power semiconductor element and said minute projection prepared on said lateral face of said level difference, which specifies the relative spatial relationship of said power semiconductor element and said second electronic circuit board at the time of lamination of said first electronic circuit and said second electronic circuit is not less than 10 micrometers, and is less than 500 micrometers.

8. A substrate according to claim 4, wherein:
a distance between said lateral face of said power semiconductor element and said lateral face of said level difference or a distance between said lateral face of said power semiconductor element and said minute projection prepared on said lateral face of said level difference, which specifies the relative spatial relationship of said power semiconductor element and said second electronic circuit board at the time of lamination of said first electronic circuit and said second electronic circuit is not less than 0.1% and less than 10% of the equivalent circle diameter of the cross section of said power semiconductor element by a plane parallel to said first surface.

9. A high-capacity module which comprises:
a first electronic circuit including a power semiconductor element, and
a second electronic circuit laminated on the side, on which said power semiconductor element is disposed, of said first electronic circuit, via said power semiconductor element, wherein:
a substrate, which is a second electronic circuit board used for said second electronic circuit, comprises a base material which comprises a dielectric layer, at least one inner layer electrode embedded inside of said base material, at least one first surface electrode formed at a first surface that is a surface on a side facing said first electronic circuit of said substrate, and at least one level difference prepared at said first surface, a thickness of at least a part of said inner layer electrode and said first surface electrode is not less than 50 micrometers in a direction perpendicular to said first surface, and said level difference is formed so that a terminal of said power semiconductor element and said first surface electrode are opposed to each other, when said power semiconductor element and said substrate are in a relative positional relationship specified by contact of at least one lateral face of said power semiconductor element, which intersects the surface opposed to said first surface, with at least one lateral face of said level difference, which intersects said first surface, at the time of lamination of said first electronic circuit and said second electronic circuit, wherein said dielectric layer comprises mainly ceramics.

10. A high-capacity module according to claim 9, wherein:
a vertical interval between a higher level of said level difference and said first surface electrode in a direction perpendicular to said first surface is not less than 10 micrometers and not more than a vertical interval between the surface on the side of said second circuit of the terminal of said power semiconductor element and the surface on the side of said second circuit of said first electronic circuit used for said first circuit in a direction perpendicular to said first surface.

11. A high-capacity module according to claim 9, wherein:
in at least one level difference, the lateral face of said level difference, which intersects said first surface, is formed as a face parallel to the lateral face of said power semiconductor element, which intersects the surface opposed to said first surface.

12. A high-capacity module according to claim 9, wherein:
at least one minute projection is prepared at least in a region, which is opposed to said lateral face of said power semiconductor element, of said lateral face of said level difference at the time of lamination of said first electronic circuit and said second electronic circuit, and the relative spatial relationship of said power semiconductor element and said substrate is specified by contact of said lateral face of said power semiconductor element and said minute projection.

13. A high-capacity module according to claim 9, wherein:
said substrate comprises plural level differences, and
the relative spatial relationship of said power semiconductor element and said substrate is uniquely specified by said plural level differences at the time of lamination of said first electronic circuit and said second electronic circuit.

14. A high-capacity module according to claim 9, wherein:
the lateral face, which intersects said first surface, of said level difference is formed as a continuous face parallel to all the lateral faces, which intersects the surface opposed to said first surface, of said power semiconductor element.

15. A high-capacity module according to claim 12, wherein:
a distance between said lateral face of said power semiconductor element and said lateral face of said level difference or a distance between said lateral face of said power semiconductor element and said minute projection prepared on said lateral face of said level difference, which specifies the relative spatial relationship of said power semiconductor element and said second electronic circuit board at the time of lamination of said first electronic circuit and said second electronic circuit is not less than 10 micrometers, and is less than 500 micrometers.

16. A high-capacity module according to claim 12, wherein:
a distance between said lateral face of said power semiconductor element and said lateral face of said level difference or a distance between said lateral face of said power semiconductor element and said minute projection prepared on said lateral face of said level difference, which specifies the relative spatial relationship of said power semiconductor element and said second electronic circuit board at the time of lamination of said first electronic circuit and said second electronic circuit is not less than 0.1% and less than 10% of the equivalent circle diameter of the cross section of said power semiconductor element by a plane parallel to said first surface.

17. A high-capacity module according to claim 14, wherein:
a gap between a depression demarcated by the lateral faces, which intersects said first surface, of said level difference and said first surface, and the surface opposed to said first surface and the lateral faces, which intersects the surface, of said power semiconductor element fitted into the depression is filled up with insulating material.

* * * * *